United States Patent
Hsu

(10) Patent No.: US 9,285,521 B2
(45) Date of Patent: Mar. 15, 2016

(54) PHOTOSENSITIVE RESIN COMPOSITION FOR COLOR FILTER AND USES THEREOF

(71) Applicant: CHI MEI CORPORATION, Tainan (TW)

(72) Inventor: Jungpin Hsu, Tainan (TW)

(73) Assignee: CHI MEI CORPORATION, Tainan (TW)

( * ) Notice: Subject to any disclaimer, the term of this patent is extended or adjusted under 35 U.S.C. 154(b) by 0 days.

(21) Appl. No.: 14/713,563

(22) Filed: May 15, 2015

(65) Prior Publication Data

US 2015/0346405 A1     Dec. 3, 2015

Related U.S. Application Data

(63) Continuation-in-part of application No. 14/645,402, filed on Mar. 11, 2015.

(30) Foreign Application Priority Data

May 28, 2014    (TW) .............................. 103118520 A

(51) Int. Cl.

| | |
|---|---|
| G03F 7/032 | (2006.01) |
| G02B 5/22 | (2006.01) |
| G02F 1/1335 | (2006.01) |
| G02B 1/04 | (2006.01) |
| G03F 7/00 | (2006.01) |
| G03F 7/30 | (2006.01) |
| G02B 5/20 | (2006.01) |

(52) U.S. Cl.
CPC ........ *G02B 5/223* (2013.01); *G02B 1/04* (2013.01); *G02F 1/133516* (2013.01); *G03F 7/0007* (2013.01); *G03F 7/032* (2013.01); *G03F 7/30* (2013.01); *G02B 5/201* (2013.01)

(58) Field of Classification Search
CPC ....... G03F 7/0007; G03F 7/032; G03F 7/033; G03F 1/133516; G02B 5/223

USPC .................... 430/7, 281.1; 349/106
See application file for complete search history.

(56) References Cited

U.S. PATENT DOCUMENTS

2013/0244177 A1    9/2013    Tseng et al.

FOREIGN PATENT DOCUMENTS

| | | | |
|---|---|---|---|
| JP | 2000-214592 A | * | 8/2000 |
| JP | P2004-138950 A | | 5/2004 |
| JP | 2009-020501 A | * | 1/2009 |
| JP | 2010-054808 A | * | 3/2010 |
| JP | 2014-041322 A | * | 3/2014 |
| TW | 201344354 | | 11/2013 |

OTHER PUBLICATIONS

Computer-generated translation of JP 2000-214592 (Aug. 2000).*
Computer-generated translation of JP 2010-0548080 (Mar. 2010).*
Computer-generated translation of JP 2009-020501 (Jan. 2009).*
Computer-generated translation of JP 2014-041322 (Mar. 2014).*
Office action issued on May 21, 2015 for the corresponding Taiwan, R.O.C. Patent Application No. 103118520.
Search Report issued on May 21, 2015 for the corresponding Taiwan, R.O.C. Patent Application No. 103118520.
English translation of the Search Report issued on May 21, 2015 for the corresponding Taiwan, R.O.C. Patent Application No. 103118520.
English abstract translation of TW 201344354, (Nov. 2013).

* cited by examiner

*Primary Examiner* — John A McPherson
(74) *Attorney, Agent, or Firm* — WPAT, P.C.; Anthony King

(57) ABSTRACT

The present invention relates to a photosensitive resin composition for a color filter and uses thereof. The photosensitive resin composition includes a pigment (A), an alkali-soluble resin (B), a cationic polymeric compound (C), a compound (D) having an ethylenically unsaturated group, a photoinitiator (E) and an organic solvent (F). The photosensitive resin composition according to the present invention can improve voltage holding ratio and developing-resistance of the color filter.

12 Claims, No Drawings

PHOTOSENSITIVE RESIN COMPOSITION FOR COLOR FILTER AND USES THEREOF

BACKGROUND OF THE INVENTION

1. Field of the Invention

The invention relates to a photosensitive resin composition for a color filter in a liquid crystal display element, and a color filter and liquid crystal display element formed by the aforementioned photosensitive resin composition. More particularly, the invention provides a photosensitive resin composition for a color filter having good voltage holding ratio, and good developing-resistance.

2. Description of the Related Art

Currently, a color filter has been applied widely in the field such as a color liquid crystal display device, a color fax machine, a color camera or the like. Since the requirement of imaging equipment, such as color liquid crystal display device, has become expanding, the production technology of the color filter also tends to diversify.

The color filter is usually obtained by a dyeing method, a printing method, a plating method, a dispersion method or the like, wherein a red pixel, a green pixel, and a blue pixel are formed on a transparent glass substrate. Generally, in order to raise the contrast of the color filter, a black matrix is usually disposed between the colored pixel layer.

The process of the aforementioned dispersion method comprises, first, dispersing pigments in a photo-curing resin to form a colored photosensitive resin composition, and then forming a colored pixel layer with the resin composition. Furthermore, the process of the dispersion method usually comprises using a metal such as chrome or chrome oxide or a photosensitive resin shading film to form a black matrix on a transparent support such as a glass substrate, and coating a photosensitive resin dispersed with a red pigment (also referred as color photoresist) on the transparent support by spin coating. After the steps of exposure and development, a red pixel can be obtained. Such process is repeated, and a green and blue pixel can be obtained thereby.

In recent years, the application of the color liquid crystal display device is not limited in personal computers, and it has been applied widely in color televisions and various monitor screens (particular in color liquid crystal screen of large sizes), so the requirement for color saturation of the liquid crystal display device becomes higher. Due to the requirement of the high color saturation, it needs to increase the concentration of pigment, and under the high-concentration pigment, the ratio of the pigment in the photosensitive resin composition is also high which leads the relative used amount of the alkali-soluble resin and photosensitive monomer to decrease. Such phenomenon causes the decrease of the degree of cross-linking after exposure and then causes poor develop-resistance.

Japanese Patent Publication No. 2004-138950 discloses a specific alkali-soluble resin for forming a colored pixel layer with a flat surface and a color filter having good pattern, developing-resistance and brightness. However, the voltage holding ratio of the photosensitive resin composition too is too low and it leads image sticking in display.

Therefore, improving the voltage holding ratio and the developing-resistance simultaneously in order to meet the modern requirements is a target remained to be achieved.

SUMMARY OF THE INVENTION

In the present invention, a specific alkali-soluble resin and cationic polymeric compound are provided to obtain a photosensitive resin composition have good voltage holding ratio, and good developing-resistance.

Therefore, the present invention relates to a photosensitive resin composition for a color filter comprising:
a pigment (A);
an alkali-soluble resin (B);
a cationic polymeric compound (C);
a compound (D) having an ethylenically unsaturated group;
a photoinitiator (E); and
an organic solvent (F);
wherein:
the alkali-soluble resin (B) comprises a first alkali-soluble resin (B-1) having a hindered-amine structure represented by Formula (I):

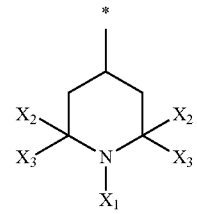

Formula (I)

in Formula (I):
$X_1$ represents a hydrogen atom, a $C_1$-$C_{18}$ linear alkyl group, branched alkyl group or cycloalkyl group, a $C_6$-$C_{20}$ aromatic group, a $C_7$-$C_{12}$ aromatic alkyl group, an acyl group, an oxygen free radical or —$OX_4$;
$X_2$ and $X_3$ independently represent a methyl group, an ethyl group, a phenyl group or $X_2$ and $X_3$ together represent a $C_4$-$C_{12}$ aliphatic ring;
$X_4$ represents a hydrogen atom, a $C_1$-$C_{18}$ linear alkyl group, branched alkyl group or cycloalkyl group, a $C_6$-$C_{20}$ aromatic group, or a $C_7$-$C_{12}$ aromatic alkyl group; and
* represents a covalent bond.

The present invention also provides a method for manufacturing a color filter comprising forming a pixel layer with the photosensitive resin composition for a color filter as mentioned above.

The present invention also provides a color filter manufactured by the method as mentioned above.

The present invention further provides a liquid crystal display element comprising the color filter as mentioned above.

DETAILED DESCRIPTION OF THE INVENTION

The present invention provides a photosensitive resin composition for a color filter comprising:
a pigment (A);
an alkali-soluble resin (B);
a cationic polymeric compound (C);
a compound (D) having an ethylenically unsaturated group;
a photoinitiator (E); and
an organic solvent (F);
wherein:
the alkali-soluble resin (B) comprises a first alkali-soluble resin (B-1) having a hindered-amine structure represented by Formula (I):

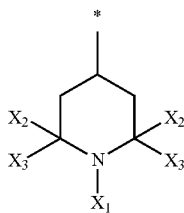

Formula (I)

in Formula (I):

$X_1$ represents a hydrogen atom, a $C_1$-$C_{18}$ linear alkyl group, branched alkyl group or cycloalkyl group, a $C_6$-$C_{20}$ aromatic group, a $C_7$-$C_{12}$ aromatic alkyl group, an acyl group, an oxygen free radical or —$OX_4$;

$X_2$ and $X_3$ independently represent a methyl group, an ethyl group, a phenyl group or $X_2$ and $X_3$ together represent a $C_4$-$C_{12}$ aliphatic ring;

$X_4$ represents a hydrogen atom, a $C_1$-$C_{18}$ linear alkyl group, branched alkyl group or cycloalkyl group, a $C_6$-$C_{20}$ aromatic group, or a $C_7$-$C_{12}$ aromatic alkyl group; and

* represents a covalent bond.

The pigment (A) according to the invention is an inorganic pigment, organic pigment or combinations thereof.

The aforementioned inorganic pigment can be metal compounds such as metal oxides, metal complex salt compounds or the like. The metal oxide can be an oxide of iron, cobalt, aluminum, cadmium, lead, copper, titanium, magnesium, chromium, zinc, antimony or the like or a composite oxide of the aforementioned metal.

The aforementioned organic pigment is selected from C.I. Pigment Yellow 1, 3, 11, 12, 13, 14, 15, 16, 17, 20, 24, 31, 53, 55, 60, 61, 65, 71, 73, 74, 81, 83, 93, 95, 97, 98, 99, 100, 101, 104, 106, 108, 109, 110, 113, 114, 116, 117, 119, 120, 126, 127, 128, 129, 138, 139, 150, 151, 152, 153, 154, 155, 156, 166, 167, 168, 175; C.I. Pigment Orange 1, 5, 13, 14, 16, 17, 24, 34, 36, 38, 40, 43, 46, 49, 51, 61, 63, 64, 71, 73; C.I. Pigment Red 1, 2, 3, 4, 5, 6, 7, 8, 9, 10, 11, 12, 14, 15, 16, 17, 18, 19, 21, 22, 23, 30, 31, 32, 37, 38, 40, 41, 42, 48:1, 48:2, 48:3, 48:4, 49:1, 49:2, 50:1, 52:1, 53:1, 57, 57:1, 57:2, 58:2, 58:4, 60:1, 63:1, 63:2, 64:1, 81:1, 83, 88, 90:1, 97, 101, 102, 104, 105, 106, 108, 112, 113, 114, 122, 123, 144, 146, 149, 150, 151, 155, 166, 168, 170, 171, 172, 174, 175, 176, 177, 178, 179, 180, 185, 187, 188, 190, 193, 194, 202, 206, 207, 208, 209, 215, 216, 220, 224, 226, 242, 243, 245, 254, 255, 264, 265; C.I. Pigment Purple 1, 19, 23, 29, 32, 36, 38, 39; C.I. Pigment Blue 1, 2, 15, 15:3, 15:4, 15:6, 16, 22, 60, 66; C.I. Pigment Green 7, 36, 37: C.I. Pigment Brown 23, 25, 28; or Pigment Black 1, 7. The mentioned-above organic pigment can be used alone or in combinations of two or more.

In one embodiment of the invention, an average particle size of primary particle of the pigment (A) is 10 nm to 200 m; preferably 20 nm to 150 nm; and more preferably 30 nm to 130 nm.

Based on 100 parts by weight of the used amount of the alkali-soluble resin (B), the used amount of the pigment (A) is from 30 parts by weight to 300 parts by weight; preferably 40 parts by weight to 280 parts by weight; and more preferably 50 parts by weight to 250 parts by weight.

When necessary, the pigment (A) can optionally include a dispersant, for example, a cationic dispersant, an anionic dispersant, a nonionic dispersant, a zwitterionic dispersant, a polysiloxane dispersant, or a fluoro surfactant.

The surfactant includes but is not limited to polyepoxyethane alkyl ethers such as polyepoxyethane lauryl ether, polyepoxyethane stearyl ether or polyepoxyethane oleyl ether; polyepoxyethane alkyl phenyl ethers such as polyepoxyethane octyl phenyl ether or polyepoxyethane nonyl phenyl ether; polyethylene glycol diesters such as polyethylene glycol dilaurate and polyethylene glycol distearate; sorbitol anhydride fatty acid esters; fatty acid-modified polyesters; and tertiary amine-modified polyurethanes. Specific examples of the surfactant are KP (manufactured by Shin-Etsu Chemical Co., Ltd.), SF-8427 (manufactured by Toray Dow Corning Silicone Co., Ltd.), Polyflow (manufactured by Kyoeisha Oil Chemical Co., Ltd.), F-Top (manufactured by Tochem Product Co., Ltd.), Megafac (manufactured by Dainippon Ink and Chemicals (DIC) Co., Ltd.), Fluorade (manufactured by Sumitomo 3M, Ltd.), Asahi Guard or Surflon (manufactured by Asahi glass Co., Ltd.). The aforementioned surfactant can be used alone or in combinations of two or more.

The alkali-soluble resin (B) according to the invention comprises a first alkali-soluble resin (B-1) and can optionally comprise a second alkali-soluble resin (B-2).

The first alkali-soluble resin (B-1) according to the invention is obtained by copolymerizing a mixture comprising an ethylenically monomer having a hindered-amine structure (b-1-1) and an ethylenically monomer containing one or more carboxylic acid groups (b-1-2).

Besides, the aforementioned mixture can optionally comprise an other copolymerizable ethylenically unsaturated monomer (b-1-3) except from the ethylenically monomer having the hindered-amine structure (b-1-1) and the ethylenically monomer containing one or more carboxylic acid groups (b-1-2).

The ethylenically monomer (b-1-1) having the hindered-amine structure represented by Formula (I) are listed below:

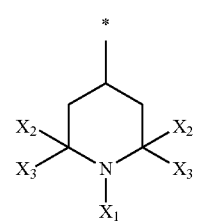

Formula (I)

in Formula (I):

$X_1$ represents a hydrogen atom, a $C_1$-$C_{18}$ linear alkyl group, branched alkyl group or cycloalkyl group, a $C_6$-$C_{20}$ aromatic group, a $C_7$-$C_{12}$ aromatic alkyl group, an acyl group, an oxygen free radical or —$OX_4$;

$X_2$ and $X_3$ independently represent a methyl group, an ethyl group, a phenyl group or $X_2$ and $X_3$ together represent a $C_4$-$C_{12}$ aliphatic ring;

$X_4$ represents a hydrogen atom, a $C_1$-$C_{18}$ linear alkyl group, branched alkyl group or cycloalkyl group, a $C_6$-$C_{20}$ aromatic group, or a $C_7$-$C_{12}$ aromatic alkyl group; and

* represents a covalent bond.

When $X_1$ and $X_4$ represent the $C_1$-$C_{18}$ linear alkyl group, branched alkyl group or cycloalkyl group, $X_1$ and $X_4$ can be a $C_1$-$C_{18}$ linear alkyl group or branched alkyl group or a $C_3$-$C_8$ cycloalkyl group, and examples can be a methyl group, an ethyl group, a n-propyl group, an isopropyl group, a n-butyl group, a t-butyl group, a n-hexyl group, a cyclohexyl group, a n-octyl group, or, a cetyl group or the like. When $X_1$ represents the $C_6$-$C_{20}$ aromatic group, examples can be a phenyl group, an α-naphthyl group or a β-naphthyl group. When $X_1$ and $X_4$ represent the $C_7$-$C_{12}$ aromatic alkyl group, $X_1$ and $X_4$ can be an aromatic group bonded with a $C_1$-$C_8$ alkyl group, and the number of carbon atoms of the aromatic group is 6 to 10, and examples can be a benzyl group, an ethylbenzene group, an α-methyl benzyl group, or a 2-phenyl propane-2-yl. When $X_1$ and $X_4$ represent the acyl group, the $C_2$-$C_8$ alkyl acyl group or aromatic acyl group, and examples can be an acetyl group or a benzoyl group.

Preferably, according to the invention, $X_1$ can be a hydrogen atom, a $C_1$-$C_5$ alkyl group or an oxygen free radical; wherein more preferable is a hydrogen atom, an oxygen free radical and a methyl group.

Moreover, $X_2$ and $X_3$ in Formula (I) together represent an aliphatic ring, and examples can be cyclopentane or cyclohexane or the like. Preferably, $X_2$ and $X_3$ can be a methyl group.

The ethylenically monomer having the hindered-amine structure represented by Formula (I) can be a compound represented by Formula (I-1) and Formula (I-2) listed below:

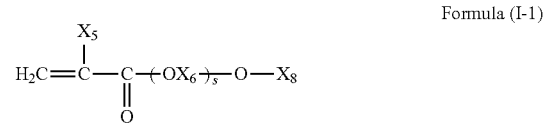

Formula (I-1)

Formula (I-2)

in Formula (I-1) and Formula (I-2), $X_5$ and $X_7$ independently represent a hydrogen atom or a methyl group; $X_6$ represents a methylene group or a $C_2$-$C_5$ alkylmethylene group; $X_8$ represents a structure represented by Formula (I); $X_9$ represents —CONH—*, —SO$_2$—, —SO$_2$NH—*, wherein * represents a covalent bond bonded with $X_8$; preferably, $X_6$ is an ethylene group or a propylene group; more preferably an ethylene group; and s is an integer from 0 to 8; more preferably 0 to 6.

Examples of the ethylenically monomer having the hindered-amine structure represented by Formula (I-1) can be the following structures represented by Formulae (I-1-1) to (I-1-7):

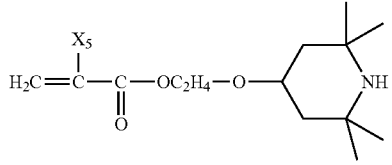

Formula (I-1-1)

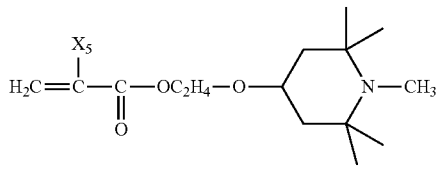

Formula (I-1-2)

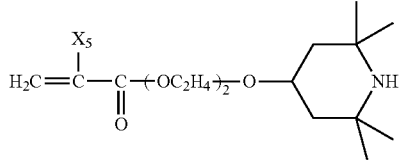

Formula (I-1-3)

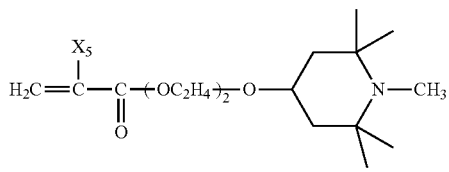

Formula (I-1-4)

Formula (I-1-5)

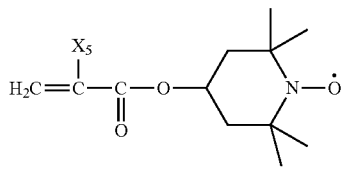

Formula (I-1-6)

Formula (I-1-7)

in Formulae (I-1-1) to (I-1-7), $X_5$ is the same with the above-mentioned definition, and not repeated again.

Examples of the ethylenically monomer having the hindered-amine structure represented by Formula (I-2) can be the following structures represented by Formulae (I-2-1) to (I-2-4):

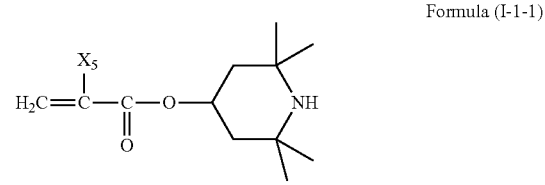

Formula (I-2-1)

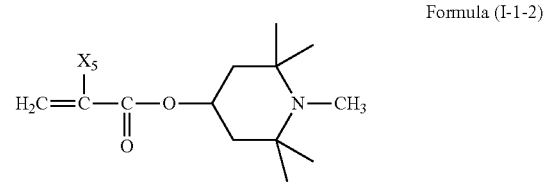

Formula (I-2-2)

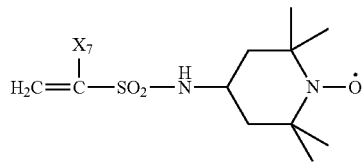

Formula (I-2-3)

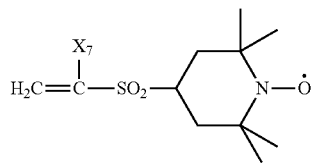

Formula (I-2-4)

in Formulae (I-2-1) to (I-2-4), $X_7$ is the same with the above-mentioned definition, and not repeated again.

The ethylenically monomer having the hindered-amine structure (b-1-1) according to the present invention can be 4-methacrylamido-2,2,6,6-tetramethylpiperidine or 2,2,6,6-tetramethylpiperidine methacrylate as the aforementioned Formula (I-1-1), and $X_5$ represents a methyl group or 1,2,2,6,6-pentamethylpiperidyl methacrylate as the aforementioned Formula (I-1-2), and $X_5$ represents a methyl group.

The aforementioned ethylenically monomer (b-1-1) having the hindered-amine structure can be used alone or in combinations of two or more.

Based on 100 parts by weight of the total amount of the aforementioned ethylenically monomer having the hindered-amine structure (b-1-1), the following ethylenically unsaturated monomer having one or more carboxyl groups (b-1-2) and the other copolymerizable ethylenically unsaturated monomer (b-1-3), the used amount of the ethylenically monomer having the hindered-amine structure (b-1-1) is 3 to 45 parts by weight; preferably 4 to 40 parts by weight; and more preferably 5 to 35 parts by weight.

Examples of the ethylenically unsaturated monomer having one or more carboxyl groups (b-1-2) include but are not limited to an unsaturated monocarboxylic compound such as acrylic acid, methacrylic acid, butenic acid, α-chloro acrylic acid, ethyl acrylic acid, benzalacetic acid, 2-acryloyloxyethylsuccinate monoester, 2-methacryloyloxyethyl succinate monoester or the like; an unsaturated dicarboxylic acid (anhydride) compound such as maleic acid, maleic anhydride, fumaric acid, itaconic acid, itaconic anhydride, citraconic acid, citraconic anhydride and the like; and an unsaturated polycarboxylic acid (anhydride) compound having more than three carboxyl groups. The above-mentioned ethylenically unsaturated monomer having one or more carboxyl groups (b-1-2) can be used alone or in combinations of two or more.

Preferably, the ethylenically unsaturated monomer having one or more carboxyl groups (b-1-2) is selected from the group consisting of acrylic acid, methacrylic acid, 2-acryloyloxyethyl succinate monoester and 2-methacryloyloxyethyl succinate monoester; wherein 2-acryloyloxyethyl succinate monoester or 2-methacryloyloxyethyl succinate monoester is more preferable.

Based on 100 parts by weight of the total amount of the aforementioned ethylenically monomer having the hindered-amine structure (b-1-1), the ethylenically unsaturated monomer having one or more carboxyl groups (b-1-2) and the following copolymerizable ethylenically unsaturated monomer (b-1-3), the used amount of the ethylenically monomer having one or more carboxyl groups (b-1-2) is 15 to 55 parts by weight, preferably 20 to 50 parts by weight, and more preferably 25 to 45 parts by weight.

Examples of the other copolymerizable ethylenically unsaturated monomer (b-1-3) except from the ethylenically monomer having the hindered-amine structure (b-1-1) and the ethylenically monomer having one or more carboxyl groups (b-1-2) include but are not limited to aromatic ethylenically compounds such as styrene (SM), α-methylstyrene, vinyl toluene, p-chlorostyrene, methoxystyrene or the like; maleimide compounds such as N-phenylmaleimide (PMI), N-o-hydroxyphenylmaleimide, N-m-hydroxyphenylmaleimide, N-p-hydroxyphenylmaleimide, N-o-methylphenylmaleimide, N-m-methylphenylmaleimide, N-p-methylphenylmaleimide, N-o-methoxyphenylmaleimide, N-m-methoxyphenylmaleimide, N-p-methoxyphenylmaleimide, N-cyclohexylmaleimide or the like; unsaturated carboxylic acid ester compounds such as methyl acrylate (MA), methyl methacrylate, ethyl acrylate, ethyl methacrylate, n-propyl acrylate, n-propyl methacrylate, isopropyl acrylate, isopropyl methacrylate, n-butyl acrylate, n-butyl methacrylate, isobutyl acrylate, isobutyl methacrylate, sec-butyl acrylate, sec-butyl methacrylate, tert-butyl acrylate, tert-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, propylene acrylate, propylene methacrylate, benzyl acrylate, benzyl methacrylate (BzMA), phenyl acrylate, phenyl methacrylate, methoxy triethylene glycol acrylate, methoxy triethylene glycol methacrylate, dodecyl methacrylate, tetradecyl methacrylate, hexadecyl methacrylate, octadecyl methacrylate, eicosyl methacrylate, docosanyl methacrylate, dicyclopentenyloxyethyl acrylate (DCPOA) or the like; N,N-dimethyl amino ethyl acrylate, N,N-dimethyl amino ethyl methacrylate, N,N-diethyl amino propyl acrylate, N,N-dimethyl amino propyl methacrylate, N,N-dibutyl amino propyl acrylate and N-isobutyl amino ethyl methacrylate; unsaturated carboxylic epoxypropyl ester compounds such as epoxypropyl acrylate, epoxypropyl methacrylate or the like; vinyl carboxylate compounds such as vinyl acetate, vinyl pivalate, vinyl butanoate or the like; unsaturated ether compounds such as methoxyethene, ethoxyethene, allyl epoxypropyl ether, methallyl epoxypropyl ether or the like; vinyl nitrile compounds such as acrylonitrile, methacrylonitrile, α-chloro acrylonitrile, vinylidene cyanide or the like; unsaturated amide compounds such as acrylamide, methacrylamide, α-chloro acrylamide, N-hydroxyethyl acrylamide, N-hydroxyethyl methacrylamide or the like; and aliphatic conjugated diene compounds such as 1,3-butadiene, isoprene, chlorinated butadiene or the like. The aforementioned other copolymerizable ethylenically unsaturated monomer (b-1-3) can be used alone or in combinations of two or more.

Preferably, the other copolymerizable ethylenically unsaturated monomer is selected from styrene, N-phenylmaleimide, methacrylate, methyl methacrylate, 2-hydroxyethyl acrylate, 2-hydroxyethyl methacrylate, benzyl acrylate, benzyl methacrylate, dicyclopentenyloxyethyl acrylate or in any combination thereof.

Based on 100 parts by weight of the total amount of the above-mentioned ethylenically monomer having the hindered-amine structure (b-1-1), the ethylenically unsaturated monomer having one or more carboxyl groups (b-1-2) and the other copolymerizable ethylenically unsaturated monomer (b-1-3), the used amount of the other copolymerizable ethylenically unsaturated monomer (b-1-3) is 0 to 82 parts by weight, preferably 10 to 70 parts by weight, and more preferably 20 to 60 parts by weight.

Based on 100 parts by weight of the total amount of the alkali-soluble resin (B), the used amount of the first alkali-soluble resin (B-1) is 30 to 100 parts by weight, preferably 35 to 90 parts by weight, and more preferably 40 to 80 parts by weight. If the alkali-soluble resin (B) is absent from the first alkali-soluble resin (B-1), the panel tends to produce ions under long time driven which decreases the voltage holding ratio.

The second alkali-soluble resin (B-2) according to the invention is obtained by polymerizing the mixture comprising an epoxy compound (b-2-1) containing at least two epoxy groups, and a compound (b-2-2) containing at least one carboxylic acid group and at least one ethylenically unsaturated group.

Besides, the mixture optionally includes a carboxylic anhydride compound (b-2-3), a compound (b-2-4) containing an epoxy group or combinations thereof.

Examples of the epoxy compound (b-2-1) containing at least two epoxy groups include a structure represented by Formula (II), a structure represented by Formula (III) or combinations thereof:

Formula (II)

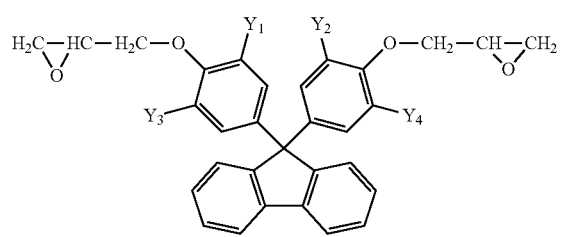

in Formula (II):

$Y_1$, $Y_2$, $Y_3$, and $Y_4$ independently represent a hydrogen atom, a halogen atom, a $C_1$-$C_5$ alkyl group, a $C_1$-$C_5$ alkoxy group, a $C_6$-$C_{12}$ aromatic group or a $C_6$-$C_{12}$ aromatic alkyl group.

The aforementioned epoxy compound represented by Formula (II) can be obtained by reacting a bisphenol fluorene and an epihalohydrin.

Examples of the aforementioned bisphenol fluorene are 9,9-bis(4-hydroxyphenyl)fluorene, 9,9-bis(4-hydroxy-3-methylphenyl)fluorene, 9,9-bis(4-hydroxy-3-chlorophenyl) fluorene, 9,9-bis(4-hydroxy-3-bromophenyl)fluorene, 9,9-bis(4-hydroxy-3-fluorophenyl)fluorene, 9,9-bis(4-hydroxy-3-methoxyphenyl)fluorene, 9,9-bis(4-hydroxy-3,5-dimethylphenyl)fluorene, 9,9-bis(4-hydroxy-3,5-dichlorophenyl)fluorene, 9,9-bis(4-hydroxy-3,5-dibromophenyl)fluorene or combinations thereof.

Examples of the aforementioned epihalohydrin include but are not limited to 3-chloro-1,2-epichlorohydrin, 3-bromo-1,2-epibromohydrin or combinations thereof.

Examples of the aforementioned bisphenol fluorene containing the epoxy group include but are not limited to ESF-300 manufactured by Nippon Steel Chemical Co., Ltd, PG-100 and EG-210 manufactured by Osaka Gas Co., Ltd, SMS-F9PhPG, SMS-F9CrG, or SMS-F914PG manufactured by S.M.S Technology Co., Ltd.

Formula (III)

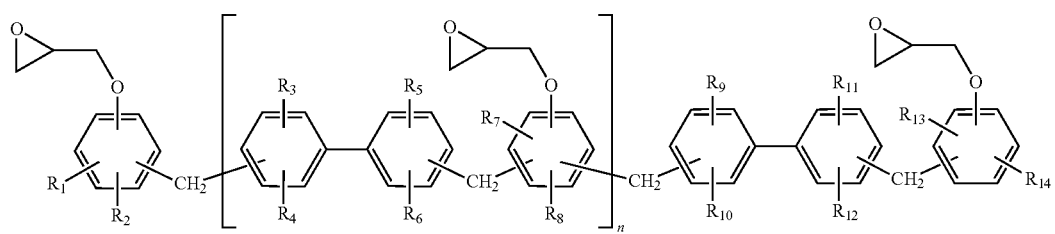

in Formula (III):
$R_1$ to $R_{14}$ independently represent a hydrogen atom, a halogen atom, a $C_1$-$C_5$ alkyl group or a $C_6$-$C_{15}$ aromatic group, and n represents an integer from 0 to 10.

The aforementioned epoxy compound represented by Formula (III) is obtained by reacting a compound represented by Formula (III-1) as below and an epihalohydrin in the presence of an alkali metal hydroxide:

Formula (III-1)

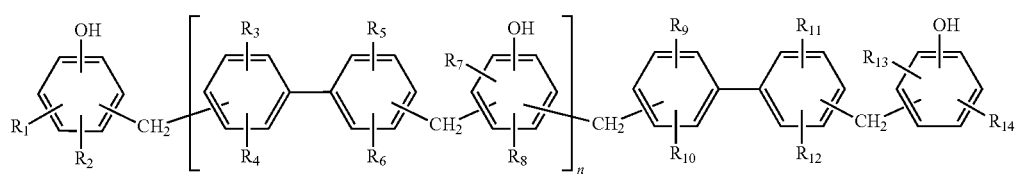

in Formula (III-1), $R_1$ to $R_{14}$ and n are the same to the above-mentioned definition, and are not repeated again.

Synthesis of the aforementioned epoxy compound represented by Formula (III-1) is obtained by condensing a compound represented by Formula (III-2) and phenol in the presence of an acid catalyst, thereby forming the compound represented by Formula (III-1). Next, a dehydrohalogenation is carried out by adding excess of an epihalohydrin into the above reaction solution, so as to obtain the epoxy compound represented by Formula (III):

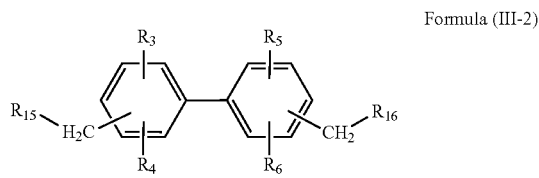

Formula (III-2)

in Formula (III-2), $R_3$ and $R_6$ are the same to the above-mentioned definition, and are not repeated again; $R_{15}$ and $R_{16}$ independently represent a halogen atom, a $C_1$-$C_6$ alkyl group or a $C_1$-$C_6$ alkoxy group. Preferably, the halogen atom can be a chlorine atom or a bromine atom; the alkyl group can be a methyl group, an ethyl group or a tert-butyl group; the alkoxy group can be a methoxy group or an ethoxy group.

Examples of the aforementioned phenol include but are not limited to phenol, cresol, ethylphenol, n-propylphenol, isobutylphenol, t-butylphenol, octylphenol, nonylphenol, xylenol, methylbutylphenol, di-t-butylphenol, vinylphenol, propenylphenol, ethinylphenol, cyclopentylphenol, cyclohexylphenol, cyclohexylcresol or the like. The aforementioned phenols can be used alone or in combinations of two or more.

Based on the used amount of the aforementioned compound represented by Formula (II-2) as 1 mole, the used amount of the phenol is 0.5 to 20 moles; preferably the used amount of the phenol is 2 to 15 moles.

Examples of the aforementioned acid catalyst include but are not limited to hydrogen chloride, sulfuric acid, p-toluenesulfonic acid, oxalic acid, boron trifluoride, aluminium chloride anhydrous, zinc chloride or the like; wherein p-toluenesulfonic acid, hydrogen chloride and sulfuric acid are preferably used. The aforementioned acid catalyst can be used alone or in any combination thereof.

In addition, there are no specific limitations to the used amount of the aforementioned acid catalyst. Preferably, based on 100 percentages by weight of the compound represented by Formula (III-2), the used amount of the acid catalyst is 0.1 to 30 percentages by weight.

The aforementioned condensation reaction can be performed without any solvent or in the presence of an organic solvent. Examples of the aforementioned organic solvent include but are not limited to toluene, xylene, methyl isobutyl ketone or the like. The aforementioned organic solvent can be used alone or in combinations of two or more.

Based on 100 percentages by weight of the total used amount of the compound represented by Formula (III-2) and the phenol, the used amount of the organic solvent is 50 percentages by weight to 300 percentages by weight; preferably 100 percentages by weight to 250 percentages by weight. In addition, the aforementioned condensation reaction is operated under a temperature of 40° C. to 180° C. for a period of 1 hour to 8 hours.

After the condensation reaction is finished, a neutralization or rinse treatment can be performed. In the aforementioned neutralization treatment, pH value of the reaction solution is adjusted to pH 3 to pH 7, and preferably pH 5 to pH 7. A neutralization reagent can be used in the aforementioned rinse treatment, in which the neutralization reagent is an alkaline substance, for examples, alkali metal hydroxides such as sodium hydroxide, potassium hydroxide or the like; alkaline earth metal hydroxides such as calcium hydroxide, magnesium hydroxide or the like; organic amines such as diethylene triamine, triethylenetetramine, aniline, phenylene diamine or the like; and ammonia, sodium dihydrogen phosphate or the like. Conventional manners can be used in the aforementioned rinse treatment. For example, a neutralizing reagent-containing solution is added into the reaction solution followed by repetitively extracting.

After the neutralization or rinse treatment is finished, unreactive phenols and solvents in the product are evaporated and removed by using a heating treatment under a decreased pressure, and then concentrated, thereby obtaining the compound represented by Formula (III-1).

Examples of the aforementioned epihalohydrin include but are not limited to 3-chloro-1,2-epichlorohydrin, 3-bromo-1,2-epibromohydrin or the combinations thereof. Before preceding the aforementioned dehydrohalogenation, alkali metal hydroxides such as sodium hydroxide, potassium hydroxide can be added before or during the reaction process. The aforementioned dehydrohalogenation is carried out under a temperature of 20° C. to 120° C. for a period of 1 hour to 10 hours.

In one embodiment, the formulation of the alkali metal hydroxide can be also used in an aqueous solution for adding into the aforementioned dehydrohalogenation reaction system. In the embodiment, when the solution of the alkali metal hydroxides is continuously added into the dehydrohalogenation reaction system, water and the epihalohydrin can be simultaneously distillated out under a normal or decreased pressure, thereby separating and removing water, as well as reflowing the epihalohydrin back into the reaction system continuously.

Before the aforementioned dehydrohalogenation is carried out, a tertiary ammonium salt such as tetramethyl ammonium chloride, tetramethyl ammonium bromide, trimethyl benzyl ammonium chloride or the like can be used as a catalyst which is added into the dehydrohalogenation reaction system, then the dehydrohalogenation is performed under a temperature of 50° C. to 150° C. for a period of 1 hour to 5 hours. Next, the alkali metal hydroxide or its solution can be then added into such reaction system under a temperature of 20° C. to 120° C. for a period of 1 hour to 10 hours for carrying out the dehydrohalogenation.

Based on the total hydroxyl groups in the compound represented by Formula (III-1) as 1 equivalent, the used amount of the epihalohydrin is 1 to 20 equivalents; preferably 2 to 10 equivalents. Based on the total hydroxyl groups in the compound represented by Formula (III-1) as 1 equivalent, the used amount of the alkali metal hydroxide added in the dehydrohalogenation is 0.8 to 15 equivalents; preferably 0.9 to 11 equivalents.

In addition, for the purpose of success of the dehydrohalogenation, besides adding an alcohol such as methanol and ethanol, a polar aprotic solvent such as dimethyl sulfone, dimethyl sulfoxide and the like can be also added. When the alcohol is used in the reaction, based on 100 percentages by weight of the used amount of the epihalohydrin, the used amount of the alcohol is 2 to 20 percentages by weight; preferably 4 to 15 percentages by weight. When the polar aprotic solvent is used in the reaction, based on 100 percentages by weight of the used amount of the epihalohydrin, the used amount of the polar aprotic solvent is 5 to 100 percentages by weight; preferably 10 to 90 percentages by weight.

After the dehydrohalogenation is completed, a rinse treatment is optionally performed. Afterward, the epihalohydrin, the alcohol and the polar aprotic solvent can be removed by using a heating treatment of 110° C. to 250° C. under a decreased pressure of less than 1.3 kPa (10 mmHg).

For preventing the resulted epoxy resin from remaining hydrolytic halogen therein, toluene, methyl isobutyl ketone or the like can be added into the solution that has reacted after the dehydrohalogenation, and then the solution of the alkali metal hydroxide such as sodium hydroxide, potassium hydroxide can be added to perform the dehydrohalogenation again. During the dehydrohalogenation, based on the total hydroxyl groups in the compound represented in Formula (III-1) as 1 equivalent, the used amount of the alkali metal hydroxide added in the dehydrohalogenation is 0.01 to 0.3 moles; preferably 0.05 to 0.2 moles. In addition, the dehydrohalogenation is operated in a temperature of 50° C. to 120° C. for a period of 0.5 hour to 2 hours.

After the dehydrohalogenation is finished, salts can be removed by using processes of filtration, rinse and so on. In addition, toluene, methyl isobutyl ketone or the like can be distilled out and removed, thereby obtaining the epoxy compound represented by Formula (III). The epoxy compound represented by Formula (III) includes but is not limited to the commercially available products such as NC-3000, NC-3000H, NC-3000S, NC-3000P or the like manufactured by Nippon Kayaku Co., Ltd.

The aforementioned the compound (b-2-2) containing at least one carboxylic acid group and at least one ethylenically unsaturated group is selected from the group consisting of the following subgroups (1) to (3): (1) acrylic acid, methacrylic acid, 2-methacryloyloxyethyl butanedioic acid, 2-methacryloyloxybutyl butanedioic acid, 2-methacryloyloxyethyl hexanedioic acid, 2-methacryloyloxybutyl hexanedioic acid, 2-methacryloyloxyethyl hexahydrophthalic acid, 2-methacryloyloxyethyl maleic acid, 2-methacryloyloxypropyl maleic acid, 2-methacryloyloxybutyl maleic acid, 2-methacryloyloxypropyl butanedioic acid, 2-methacryloyloxypropyl hexanedioic acid, 2-methacryloyloxypropyl tetrahydrophthalic acid, 2-methacryloyloxypropyl phthalic acid, 2-methacryloyloxybutyl phthalic acid, and 2-methacryloyloxybutyl hydrophthalic acid; (2) a compound obtained by reacting (methyl)acrylate ester containing a hydroxyl group with a dicarboxylic acid compound, in which the dicarboxylic acid compound includes but is not limited to hexanedioic acid, butanedioic acid, maleic acid and phthalic acid; and (3) a hemiester compound obtained by reacting (methyl)acrylate ester containing a hydroxyl group with a carboxylic acid anhydride compound (b-2-3), in which the (methyl)acrylate ester containing a hydroxyl group includes but is not limited to (2-hydroxyethyl) acrylate, (2-hydroxyethyl) methacrylate, (2-hydroxypropyl) acrylate, (2-hydroxypropyl) methacrylate, (4-hydroxybutyl) acrylate, (4-hydroxybutyl) methacrylate, pentaerythritol triacrylate and the like.

The aforementioned carboxylic anhydride compound (b-2-3) is selected from the group consisting of the following subgroups (1) to (2): (1) dicarboxylic anhydride compounds such as butanedioic anhydride, maleic anhydride, itaconic anhydride, phthalic anhydride, tetrahydrophthalic anhydride, hexahydrophthalic anhydride, methyl tetrahydrophthalic anhydride, methyl hexahydrophthalic anhydride, methyl endo-methylene tetrahydrophthalic anhydride, chlorendic anhydride, glutaric anhydrid, 1,3-dioxoisobenzofuran-5-carboxylic anhydride and the like; and (2) tetracarboxylic dianhydride compounds such as benzophenone tetracarboxylic dianhydride (referred to as BTDA), diphenyl tetracarboxylic acid dianhydride, diphenyl ether tetracarboxylic acid dianhydride and the like.

Examples of the aforementioned compound (b-2-4) containing the epoxy group are glycidyl methacrylate, 3,4-epoxycyclohexyl methacrylate, a glycidyl ether compound containing an unsaturated group, an unsaturated compound containing an epoxy group or any combinations thereof.

Examples of the glycidyl ether compound containing the unsaturated group include but are not limited to the commercially available products such as Denacol EX-111, Denacol EX-121, Denacol EX-141, Denacol EX-145, Denacol EX-146, Denacol EX-171, Denacol EX-192 manufactured by Nagase ChemteX Corporation or the like.

The epoxy compound (b-2-1) containing at least two epoxy groups represented by Formula (II) or Formula (III) and the compound (b-2-2) containing at least one carboxylic acid group and at least one ethylenically unsaturated group are polymerized to form an intermediate product containing a hydroxyl group, and then the intermediate product reacts with the carboxylic acid anhydride compound (b-2-3), so as to obtain the second alkali-soluble resin (B-2). Based on the total amount of the hydroxyl group as 1 equivalent, the used amount of the carboxylic acid anhydride compound (b-2-3) preferably is 0.4 to 1 equivalent; more preferably 0.75 to 1 equivalent. When pluralities of the carboxylic acid anhydride compounds (b-2-3) are used in this reaction, they can be added sequentially or simultaneously in the reaction. Preferably, when the dicarboxylic acid anhydride compound and the tetracarboxylic acid anhydride compound are employed as the carboxylic acid anhydride compound (b-2-3), the molar ratio of dicarboxylic acid anhydride compound to the tetracarboxylic acid anhydride compound may be 1/99 to 90/10, and preferably 5/95 to 80/20. In addition, this reaction can be operated under a temperature of 50° C. to 130° C.

In other embodiment of the invention, the aforementioned second alkali-soluble resin (B-2) can be synthesized as follows. The epoxy compound (b-2-1) containing at least two epoxy groups represented by Formula (II) or Formula (III) and the compound (b-2-2) containing at least one carboxyl group and at least one ethylenically unsaturated group are polymerized to form an intermediate product containing a hydroxyl group, and then the intermediate product reacts with the carboxylic acid anhydride compound (b-2-3), the compound (b-2-4) containing the epoxy group or any combination thereof, so as to obtain the second alkali-soluble resin (B-2). Based on the total amount of the epoxy groups of the epoxy compound containing at least two epoxy groups represented by Formula (II) or Formula (III) as 1 equivalent, the used amount of the compound (b-2-2) containing at least one carboxyl group and at least one ethylenically unsaturated group is 0.8 to 1.5 equivalent; preferably 0.9 to 1.1 equivalent. Based on the total hydroxyl groups of the intermediate product containing the hydroxyl group as 100 percentage by mole (mole %), the used amount of the carboxylic acid anhydride compound (b-2-3) is 10 to 100 mole %; preferably 20 to 100 mole %; more preferably 30 to 100 mole %.

During the preparation of the second alkali-soluble resin (B-2), the reaction solution is usually added with an alkaline compound as a reaction catalyst for accelerating the reaction. Examples of the reaction catalyst include but are not limited to triphenyl phosphine, triphenyl stibine, triethylamine, triethanolamine, tetramethylammonium chloride, benzyltriethylammonium chloride or the like. The reaction catalyst can be used alone or in combinations of two or more.

Preferably, based on 100 parts by weight of the total used amount of the epoxy compound (b-2-1) containing at least two epoxy groups and the compound (b-2-2) containing at least one carboxyl group and at least one ethylenically unsaturated group, the used amount of the reaction catalyst is 0.01 to 10 parts by weight, and preferably 0.3 to 5 parts by weight.

In addition, for the purpose of controlling the polymerization degree, a polymerization inhibitor is usually added into the reaction solution. Examples of the aforementioned polymerization inhibitor include but are not limited to methoxyphenol, methylhydroquinone, hydroquinone, 2,6-di-t-butyl-p-cresol, phenothiazine or the like. The polymerization inhibitor can be used alone or in combinations of two or more.

Based on 100 parts by weight of the total used amount of the epoxy compound (b-2-1) containing at least two epoxy groups and the compound (b-2-2) containing at least one carboxyl group and at least one ethylenically unsaturated group, the used amount of the polymerization inhibitor is 0.01 to 10 parts by weight; preferably 0.1 to 5 parts by weight.

During the preparation of the second alkali-soluble resin (B-2), a polymerization solvent can be used if necessary. Examples of the polymerization solvent include but are not limited to alcohol compounds such as ethanol, propanol, isopropanol, butanol, isobutanol, 2-butanol, hexanol or ethylene glycol; ketone compounds such as methyl ethyl ketone or cyclohexanone; aromatic hydrocarbon compounds such as toluene or xylene; cellosolve compounds such as cellosolve or butyl cellosolve; carbitol compounds such as carbitol or butyl carbitol; propylene glycol alkyl ether compounds such as propylene glycol monomethyl ether; poly(propylene glycol)alkyl ether compounds such as di(propylene glycol)methyl ether, acetate ester compounds such as ethyl acetate, butyl acetate, ethylene glycol monoethyl ether acetate, propylene glycol methyl ether acetate and the like; alkyl lactate compounds such as ethyl lactate or butyl lactate; or dialkyl glycol ethers. The aforementioned polymerization solvent can be used alone or in combinations of two or more.

An acid equivalent of the second alkali-soluble resin (B-2) is 50 mg KOH/g to 200 mg KOH/g, and preferably 60 mg KOH/g to 150 mg KOH/g.

Based on 100 parts by weight of the used amount of the alkali-soluble resin (B), the used amount of the second alkali-soluble resin (B-2) is from 0 to 70 parts by weight; preferably from 10 to 65 parts by weight; more preferably from 20 to 60 parts by weight. If the alkali-soluble resin (B) comprises the second alkali-soluble resin (B-2), the photosensitive resin composition for a color filter has good developing-resistance.

The photosensitive resin composition for the color filter according to invention comprises the cationic polymeric compound (C). If the cationic polymeric compound (C) is absent, the developing-resistance is poor.

In one embodiment of the invention, based on 100 parts by weight of the used amount of the alkali-soluble resin (B), the used amount of the cationic polymeric compound (C) is from 5 to 100 parts by weight; preferably 10 to 90 parts by weight; more preferably 15 to 80 parts by weight.

In one preferred embodiment of the invention, the cationic polymeric compound (C) comprises an oxetane compound (C-1).

Examples of the oxetane compound (C-1) are trimethylene oxide, 3,3-dimethyl oxetane, 3,3-dichloro-methyl oxetane, 3-ethyl-3-phenoxymethyl oxetane, 3-ethyl-3-hydroxymethyloxetane, 1,4-bis{[(3-ethyloxetan-3-yl)methyoxy]methyl}benzene, bis[1-ethyl(3-oxetanyl)]methyl ether, 3-ethyl-3-(2-ethyl xylo carboxymethyl)oxetane, 3-ethyl-3-(cyclohexyloxy)methyloxetane, 1,3-bis[(3-ethyloxetan-3-yl)methoxy]benzene, or derives thereof such as compounds represented by Formulae (1) to (5).

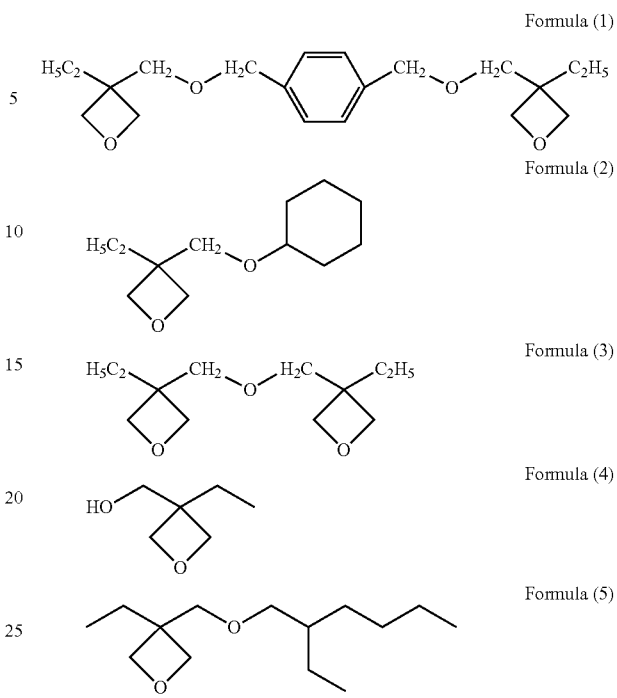

In one preferred embodiment of the invention, the cationic polymeric compound (C) comprises an other cationic polymeric compound (C-2). Examples of the other cationic polymeric compound (C-2) include but are not limited to an epoxy compound, an oxolane compound, a cyclic acetal compound, a cyclic lactone compound, a thiirane compound, a thietane compound, a spiroorthoester compound formed by reacting a lactone compound and an epoxy compound, a vinyl ether compound, or an other compound having an ethylenically unsaturated group.

Examples of the epoxy compound include but are not limited to bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolac resin, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxy cyclohexane carboxylate, 2-(3,4-epoxy cyclohexyl-5,5-spiro-3,4-epoxy)cyclohexane-meta-dioxane, bis(3,4-epoxycyclohexylmethyl) adipate, bis(3,4-epoxy-6-methylcyclohexylmethyl) adipate, 3,4-epoxy-6-methyl-3',4'-epoxy-6'-methylcyclohexane carboxylate, ε-caprolactone-modified 3,4-epoxycyclohexylmethyl-3'3,4,4'-epoxy cyclohexane carboxylate, trimethylcaprolactone-modified epoxycyclohexylmethyl-3',4'-epoxy cyclohexane carboxylate, β-methyl-δ-valerolactone-modified 3,4-epoxycyclohexylmethyl-3',4'-epoxy cyclohexane carboxylate, methylenebis(3,4-epoxycyclohexane), ethylene glycol of di (3,4-epoxycyclohexylmethyl) ether, ethylene bis(3,4-epoxy cyclohexane carboxylate), epoxy cyclo hexahydro di-n-octyl phthalate, epoxy cyclo hexahydro di-2-ethylhexyl phthalate, 1,4-butanediol diglycidyl ether), 1,6-hexanediol diglycidyl ether, neopentyl glycol diglycidyl ether, trimethylolpropane triglycidyl ether, polyethylene glycol diglycidyl ether, glycerol triglycidyl ether, polypropylene glycol diglycidyl ether, polyglycidyl ethers of polyether polyol obtained by adding an aliphatic polyol (such as ethylene glycol, propylene glycol, glycerin) with one or more alkylene oxide, diglycidyl ester of a long-chain aliphatic dicarboxylic acid, monoglycidyl ether of an aliphatic higher alcohol, monoglycidyl ether of polyether alcohol obtained by adding oxyalkylenes (such as phenol, cresol, 4-n-butylphenol), glycidyl ester of higher fatty acid, epoxy butyl oleate, epoxy octyl oleate, epoxidized soybean oil, epoxidized linseed oil, and epoxidized polybutadiene, or derives thereof, Celoxide 2021P, CEL3000 (both manufactured by Daicel Chemical Ind., Ltd.).

Examples of the oxolane compound include but are not limited to tetrahydrofuran or 2,3-dimethyl tetrahydrofuran.

Examples of the cyclic acetal compound include but are not limited to trioxane, 1,3-dioxolane or 1,3,6-trioxane cyclooctane.

Examples of the cyclic lactone compound include but are not limited to β-propiolactone or ε-caprolactone.

Examples of the thiirane compound include but are not limited to ethylene sulfide, 1,2-propylene sulfide, or thio epichlorohydrin.

Examples of the thietane compound include but are not limited to 3,3,-dimethyl thietane.

Examples of the vinyl ether compound include but are not limited to ethylene glycol divinyl ether, triethylene glycol divinyl ether, or trimethylolpropane ether.

Examples of the other compound having an ethylenically unsaturated group include but are not limited to vinyl cyclohexane, isobutylene, or polybutadiene.

Examples of commercialized products of the other cationic polymeric compound (C-2) include but are not limited to TDVE (manufactured by Maruzen Petrochemical), TMPVE (manufactured by Nippon Carbide Industries Co., Inc), UVR-6100, UVR-6105, UVR-6110, UVR-6128, UVR-6200, UVR-6216 (all manufactured by Union Carbide), Celoxide 2021, Celoxide 2081, Celoxide 2083, Celoxide 2085, EPOLEAD GT-300, EPOLEAD GT-301, EPOLEAD GT-302, EPOLEAD GT-400, EPOLEAD GT-401, EPOLEAD GT-403 (all manufactured by Daicel Chemical Ind., Ltd), KRM-2100, KRM-2110, KRM-2199, KRM-2200, KRM-2400, KRM-2408, KRM-2410, KRM-2490, KRM-2720, KRM-2750 (all manufactured by ADEKA Co., Ltd), Rapi-cure DVE-3, CHVE, PEPC (all manufactured by ISP Ltd), EPICOAT 812, EPICOAT 828, EPICOAT 872, EPICOAT 1031, EPICOAT CT508 (all manufactured by Nippon Epoxy Resin Co.), VECOMER 2010, VECOMER 2020, VECOMER4010, VECOMER 4020 (all manufactured by Allied Signal).

In one embodiment of the invention, based on 100 parts by weight of the used amount of the alkali-soluble resin (B), the used amount of the oxetane compound (C-1) is from 8 to 80 parts by weight; preferably 10 to 70 parts by weight; more preferably 15 to 60 parts by weight. If the oxetane compound (C-1) is used, the photosensitive resin composition for the color filter has good developing-resistance.

In one preferred embodiment of the invention, the photosensitive resin composition for the color filter comprises a compound (D) having an ethylenically unsaturated group.

The compound (D) having the ethylenically unsaturated group refers to an unsaturated compound having at least one ethylenically unsaturated group. Examples of the compound having one ethylenically unsaturated group can be used alone or in combinations of two or more and include but are not limited to acrylamide, acryloylmorpholine, methylacryloylmorpholine, 7-amino-3,7-dimethyloctyl acrylate, 7-amino-3,7-dimethyloctyl methylacrylate, iso-butoxymethyl acrylamide, iso-butoxymethyl methylacrylamide, iso-bornyloxyethyl acrylate, iso-bornyloxyethyl methylacrylate, iso-bornyl acrylate, iso-bornyl methylacrylate, 2-ethylhexyl acrylate, 2-ethylhexyl methylacrylate, ethyl diethylene glycol acrylate, ethyl diethylene glycol methylacrylate, t-octyl acrylamide, t-octyl methylacrylamide, diacetone acrylamide, diacetone methylacrylamide, dimethylaminoethyl acrylate, dimethylaminoethyl methylacrylate, dodecyl acrylate, dodecyl methylacrylate, dicyclopentenyloxyethyl acrylate, dicyclopentenyloxyethyl methyl acrylate, dicyclopentenyl acrylate, dicyclopentenyl methylacrylate, N,N-dimethyl acrylamide, N,N-dimethyl methylacrylamide, tetrachlorophenyl acrylate, tetrachlorophenyl methylacrylate, 2-tetrachlorophenoxy ethyl acrylate, 2-tetrachlorophenoxy ethyl methylacrylate, tetrahydrofurfuryl acrylate, tetrahydrofurfuryl methylacrylate, tetrabromophenyl acrylate, tetrabromophenyl methylacrylate, 2-tetrabromophenoxyethyl acrylate, 2-tetrabromophenoxyethyl methylacrylate, 2-trichlorophenoxyethyl acrylate, 2-trichlorophenoxyethyl methylacrylate, tribromophenyl acrylate, tribromophenyl methylacrylate, 2-tribromophenoxyethyl acrylate, 2-tribromophenoxyethyl methylacrylate, 2-hydroxyethyl acrylate, 2-hydroxyethyl methacrylate, 2-hydroxypropyl acrylate, 2-hydroxypropyl methylacrylate, vinylcaprolactam, N-vinylpyrrolidone, phenoxyethyl acrylate, phenoxyethyl methylacrylate, pentachlorophenyl acrylate, pentachlorophenyl methylacrylate, pentabromophenyl acrylate, pentabromophenyl methylacrylate, polyethylene glycol monoacrylate, polyethylene glycol monomethylacrylate, polypropylene glycol monoacrylate, polypropylene glycol monomethylacrylate, bornyl acrylate, or bornyl methylacrylate.

Examples of the compound having two or more ethylenically unsaturated groups can be used alone or in admixture of two or more thereof and include but are not limited to ethylene glycol diacrylate, ethylene glycol dimethylacrylate, dicyclopentenyl diacrylate, dicyclopentenyl dimethylacrylate, triethylene glycol diacrylate, tetraethylene glycol diacrylate, tetraethylene glycol dimethylacrylate, tri(2-hydroxyethyl) isocyanate diacrylate, tri(2-hydroxyethyl) isocyanate dimethylacrylate, tri(2-hydroxyethyl) isocyanate triacrylate, tri(2-hydroxyethyl) isocyanate trimethylacrylate, caprolactone-modified tri(2-hydroxyethyl) isocyanate triacrylate, caprolactone-modified tri(2-hydroxyethyl) isocyanate trimethylacrylate, trimethylolpropyl triacrylate, trimethylolpropyl trimethylacrylate, ethylene oxide (hereinafter abbreviated as EO) modified trimethylolpropyl triacrylate, EO-modified trimethylolpropyl trimethylacrylate, propylene oxide (hereinafter abbreviated as PO) modified trimethylolpropyl triacrylate, PO-modified trimethylolpropyl trimethylacrylate, tripropylene glycol diacrylate, tripropylene glycol dimethylacrylate, neo-pentyl glycol diacrylate, neo-pentyl glycol dimethylacrylate, 1,4-butanediol diacrylate, 1,4-butanediol dimethylacrylate, 1,6-hexanediol diacrylate, 1,6-hexanediol dimethylacrylate, pentaerythritol triacrylate, pentaerythritol trimethylacrylate, pentaerythritol tetraacrylate, pentaerythritol tetramethylacrylate, polyester diacrylate, polyester dimethylacrylate, polyethylene glycol diacrylate, polyethylene glycol dimethylacrylate, dipentaerythritol hexaacrylate, dipentaerythritol hexamethylacrylate, dipentaerythritol pentaacrylate, dipentaerythritol pentamethylacrylate, dipentaerythritol tetraacrylate, dipentaerythritol tetramethylacrylate, caprolactone-modified dipentaerythritol hexaacrylate, caprolactone-modified dipentaerythritol hexamethylacrylate, caprolactone-modified dipentaerythritol pentaacrylate, caprolactone-modified dipentaerythritol pentamethylacrylate, ditrimethylolpropyl tetraacrylate, ditrimethylolpropyl tetramethylacrylate, EO-modified bisphenol A diacrylate, EO-modified bisphenol A dimethylacrylate, PO-modified bisphenol A diacrylate, PO-modified bisphenol A dimethylacrylate, EO-modified hydrogenated bisphenol A diacrylate, EO-modified hydrogenated bisphenol A dimethylacrylate, PO-modified hydrogenated bisphenol A diacrylate, PO-modified hydrogenated bisphenol A dimethylacrylate, PO-modified glycerol triacrylate, EO-modified bisphenol F diacrylate, EO-modified bisphenol F dimethylacrylate, phenol novolac polyglycidyl ether acrylate, phenol novolac polyglycidyl ether methylacrylate, or TO-1382 (manufactured by Toagosei Company).

Preferably, the compound (D) having the ethylenically unsaturated group is selected from trimethylolpropyl triacrylate, EO-modified trimethylolpropyl triacrylate, PO-modified trimethylolpropyl triacrylate, pentaerythritol triacrylate, pentaerythritol tetraacrylate, dipentaerythritol hexaacrylate, dipentaerythritol pentaacrylate, dipentaerythritol tetraacrylate, caprolactone-modified dipentaerythritol hexaacrylate, ditrimethylolpropyl tetraacrylate, PO-modified glycerol triacrylate or combinations thereof.

Preferably, based on 100 parts by weight of the used amount of the alkali-soluble resin (B), the used amount of the compound (D) having the ethylenically unsaturated group is from 30 to 300 parts by weight; preferably 40 to 250 parts by weight; more preferably 50 to 200 parts by weight.

In one preferred embodiment of the invention, the photosensitive resin composition for a color filter comprises a photoinitiator (E).

Examples of the photoinitiator (E) can be used alone or in combinations and include but are not limited to a O-acyloxime compound, a triazine compound, an acetophenone compound, a biimidazole compound, or a benzophenone compound.

Examples of the O-acyloxime compound can be used alone or in combinations and include but are not limited to 1-[4-(phenylthio)phenyl]-heptane-1,2-dione 2-(O-benzoyloxime), 1-[4-(phenylthio)phenyl]-octane-1,2-dione 2-(O-benzoyloxime), 1-[4-(benzoyl)phenyl]-heptane-1,2-dione 2-(O-benzoyloxime), 1-[9-ethyl-6-(2-methylbenzoyl)-9H-carbazol-3-yl]-ethylketo 1-(O-acetyloxime), 1-[9-ethyl-6-(3-methylbenzoyl)-9H-carbazol-3-yl]-ethylketo 1-(O-acetyloxime), 1-[9-ethyl-6-benzoyl-9H-carbazol-3-yl]-ethylketo 1-(O-acetyloxime), ethylketo-1-[9-ethyl-6-(2-methyl-4-tetrahydrofurylbenzoyl)-9H-carbazol-3-yl]-1-(O-acetyloxime), ethylketo-1-[9-ethyl-6-(2-methyl-5-tetrahydropyranylbenzoyl)-9H-carbazol-3-yl]-1-(O-acetyloxime), ethylketo-1-[9-ethyl-6-(2-methyl-4-tetrahydrofurylmethoxybenzoyl)-9H-carbazol-3-yl]-1-(O-acetyloxime), ethylketo-1-[9-ethyl-6-(2-methyl-5-tetrahydrofurylmethoxybenzoyl)-9H-carbazol-3-yl]-1-(O-acetyloxime), ethylketo-1-[9-ethyl-6-{2-methyl-4-(2,2-dimethyl-1,3-dioxolyl)benzoyl}-9H-carbazol-3-yl]-1-(O-acetyloxime), or ethylketo-1-[9-ethyl-6-{2-methyl-4-(2,2-dimethyl-1,3-dioxolyl)methoxybenzoyl}-9H-carbazol-3-yl]-1-(O-acetyloxime).

Examples of the triazine compound can be used alone or in combinations and include but are not limited to 2,4-bis(trichloromethyl)-6-(p-methoxy)styryl-s-triazine, 2,4-bis(trichloromethyl)-6-(1-p-dimethylaminophenyl-1,3-butadienyl)-s-triazine, or 2-trichloromethyl-4-amino-6-(p-methoxy)styryl-s-triazine.

Examples of the acetophenone compound can be used alone or combinations and include but are not limited to p-dimethylaminoacetophenone, α,α'-dimethoxyazoxyacetophenone, 2,2'-dimethyl-2-phenylacetophenone, p-methoxyacetophenone, 2-methyl-1-(4-methylthiophenyl)-2-morpholino-1-propanone, or 2-benzyl-2-N,N-dimethylamino-1-(4-morpholinophenyl)-1-butanone.

Examples of the biimidazole compound can be used alone or in combinations and include but are not limited to 2,2'-bis(o-chlorophenyl)-4,4',5,5'-tetraphenylbiimidazole, 2,2'-bis(o-fluorophenyl)-4,4',5,5'-tetraphenylbiimidazole, 2,2'-bis(o-methylphenyl)-4,4',5,5'-tetraphenylbiimidazole, 2,2'-bis(o-methoxyphenyl)-4,4',5,5'-tetraphenylbiimidazole, 2,2'-bis(o-ethylphenyl)-4,4',5,5'-tetraphenylbiimidazole, 2,2'-bis(p-methoxyphenyl)-4,4',5,5'-tetraphenylbiimidazole, 2,2'-bis(2,2',4,4'-tetramethoxyphenyl)-4,4',5,5'-tetraphenylbiimidazole, 2,2'-bis(2-chlorophenyl)-4,4',5,5'-tetraphenylbiimidazole, or 2,2'-bis(2,4-dichlorophenyl)-4,4',5,5'-tetraphenylbiimidazole.

Examples of the benzophenone compound can be used alone or combinations and include but are not limited to thioxanthone, 2,4-diethylthioxanthone, thioxanthone-4-sulfone, benzophenone, 4,4'-bis(dimethylamino)benzophenone, or 4,4'-bis(diethylamino)benzophenone.

Preferably, the photoinitiator (E) is 1-[4-(phenylthio)phenyl]-octane-1,2-dione 2-(O-benzoyloxime), 1-[9-ethyl-6-(2-methylbenzoyl)-9H-carbazol-3-yl]-ethylketo 1-(O-acetyloxime), ethylketo-1-[9-ethyl-6-(2-methyl-4-tetrahydrofurylmethoxybenzoyl)-9H-carbazol-3-yl]-1-(O-acetyloxime), ethylketo-1-[9-ethyl-6-{2-methyl-4-(2,2-dimethyl-1,3-dioxolyl)methoxybenzoyl}-9H-carbazol-3-yl]-1-(O-acetyloxime), 2,4-bis(trichloromethyl)-6-(p-methoxy)styryl-s-triazine, 2-benzyl-2-N,N-dimethylamino-1-(4-morpholinophenyl)-1-butanone, 2,2'-bis(2,4-dichlorophenyl)-4,4',5,5'-tetraphenylbiimidazole, 4,4'-bis(diethylamino)benzophenone, or combinations thereof.

In addition to the photoinitiator (E), other initiators can be further added into the photosensitive resin composition of the present invention provided that the desirable physical properties of the photosensitive resin composition are not affected. Examples of the other initiators include a α-diketone compound, an acyloin compound, an acyloin ether compound, an acylphosphineoxide compound, a quinine compound, a halide compound, a peroxide compound, or the like.

Examples of the α-diketone compound can be used alone or in combinations and include but are not limited to a benzyl compound or an acetyl compound. Examples of the acyloin compound can be used alone or in combinations and include but are not limited to benzoin. Examples of the acyloin ether compound can be used alone or in combinations and include but are limited to benzoin methylether, benzoin ethylether, or benzoin isopropyl ether.

Examples of the acylphosphine oxide compound can be used alone or in combinations and include but are not limited to 2,4,6-trimethylbenzoyl diphenylphosphine oxide, or bis-(2,6-dimethoxybenzoyl)-2,4,4-trimethyl benzyl phosphine oxide. Examples of the quinone compound can be used alone or in combinations and include but are not limited to anthraquinone, 1,4-naphthoquinone or the like. Examples of the halide compound can be used alone or in combinations and include but are not limited to phenacyl chloride, tribromomethyl phenylsulfone, or tris(trichloromethyl)-s-triazine. Examples of the peroxide compound can be used alone or in combinations and include but are not limited to di-tert-butyl peroxide or the like.

Preferably, based on 100 parts by weight of the used amount of the alkali-soluble resin (B), the used amount of the photoinitiator (E) is from 10 to 100 parts by weight; preferably 15 to 90 parts by weight; more preferably 20 to 80 parts by weight.

Examples of the organic solvent (F) according to the invention include but are not limited to (poly)alkylene glycol monoalkylether, such as ethylene glycol monomethylether, ethylene glycol monoethylether, diethylene glycol monomethylether, diethylene glycol monoethylether, diethylene glycol n-propylether, diethylene glycol n-butylether, triethylene glycol monomethylether, triethylene glycol monoethylether, propylene glycol monomethylether, propylene glycol monoethylether, dipropylene glycol monomethylether, dipropylene glycol monoethylether, dipropylene glycol n-propylether, dipropylene glycol n-butylether, tripropylene glycol monomethylether, tripropylene glycol monoethylether or the like; (poly)alkylene glycol monoalkylether acetate such as ethylene glycol monomethylether acetate, ethylene glycol monoethylether acetate, propylene glycol monomethylether acetate, propylene glycol monoethylether acetate and the like; ether such as diethylene glycol dimethyl ether, diethylene glycol ethyl methyl ether, diethylene glycol diethyl ether, tetrahydrofuran and the like; ketone such as methyl ethyl ketone, cyclohexanone, 2-heptanone, 3-heptanone or the like; lactic alkyoxycarbonyl such as methyl 2-hydroxypropanoate, ethyl 2-hydroxypropanoate or the like; ester such as methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate, ethoxy ethyl acetate, hydroxy ethyl acetate, methyl 2-hydroxy-3-methylbutyrate, 3-methyl-3-methoxybutyl acetate, 3-methyl-3-methoxybutyl acrylic acid, ethyl acetate, n-butyl acetate, n-propyl acetate, isopropyl acetate, isobutyl acetate, n-pentyl acetate, isopentyl acetate, n-butyl propionate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, 2-oxidebutyric acid ethyl ester or the like; aromatic hydrocarbons such as toluene, dimethylbenzene or the like; carboxylic acid amide such as N-methyl-pyrrolidinone, N,N-dimethyl formamide, N,N-dimethyl acetamide or the like.

Preferably, the organic solvent (F) is propylene glycol monomethylether acetate, or ethyl 3-ethoxypropionate.

Preferably, based on 100 parts by weight of the used amount of the alkali-soluble resin (B), the used amount of the organic solvent (F) is from 500 to 5000 parts by weight; preferably 800 to 4500 parts by weight; more preferably 1000 to 4000 parts by weight.

The photosensitive resin composition for a color filter according to the invention can optionally comprise a dye (G), wherein the dye (G) has been applied widely in the color filter having good contrast and brightness.

In one embodiment of the invention, a red dye is C.I. Acid Red 1, 2, 3, 4, 5, 6, 7, 8, 9, 10, 11, 12, 13, 14, 15, 16, 17, 18, 19, 20, 22, 23, 24, 25, 25:1, 26, 26:1, 26:2, 27, 29, 30, 31, 32, 33, 34, 35, 36, 37, 39, 40, 41, 42, 43, 44, 45, 47, 50, 52, 53, 54, 55, 56, 57, 59, 60, 62, 64, 65, 66, 67, 68, 70, 71, 73, 74, 76, 76:1, 80, 81, 82, 83, 85, 86, 87, 88, 89, 91, 92, 93, 97, 99, 102, 104, 106, 107, 108, 110, 111, 113, 114, 115, 116, 120, 123, 125, 127, 128, 131, 132, 133, 134, 135, 137, 138, 141, 142, 143, 144, 148, 150, 151, 152, 154, 155, 157, 158, 160, 161, 163, 164, 167, 170, 171, 172, 173, 175, 176, 177, 181, 229, 231, 237, 239, 240, 241, 242, 249, 252, 253, 255, 257, 260, 263, 264, 266, 267, 274, 276, 280, 286, 289, 299, 306, 309, 311, 323, 333, 324, 325, 326, 334, 335, 336, 337, 340, 343, 344, 347, 348, 350, 351, 353, 354, 356, 388 or the like; and C.I. Direct Red 1, 2, 2:1, 4, 5, 6, 7, 8, 10, 10:1, 13, 14, 15, 16, 17, 18, 21, 22, 23, 24, 26, 26:1, 28, 29, 31, 33, 33:1, 34, 35, 36, 37, 39, 42, 43, 43:1, 44, 46, 49, 52, 53, 54, 55, 56, 57, 58, 59, 60, 61, 62, 67, 67:1, 68, 72, 72:1, 73, 74, 75, 77, 78, 79, 81, 81:1, 85, 86, 88, 89, 90, 97, 100, 101, 101:1, 107, 108, 110, 114, 116, 117, 120, 121, 122, 122:1, 124, 125, 127, 127:1, 127:2, 128, 129, 130, 132, 134, 135, 136, 137, 138, 140, 141, 148, 149, 150, 152, 153, 154, 155, 156, 169, 171, 172, 173, 174, 175, 176, 177, 179, 180, 181, 182, 185, 186, 189, 204, 211, 213, 214, 217, 222, 224, 225, 226, 227, 228, 232, 236, 237, 238 or the like.

In one embodiment of the invention, a yellow dye is C.I. Acid Yellow 2, 3, 4, 5, 6, 7, 8, 9, 9:1, 10, 11, 11:1, 12, 13, 14, 15, 16, 17, 17:1, 18, 20, 21, 22, 23, 25, 26, 27, 29, 30, 31, 33, 34, 36, 38, 39, 40, 40:1, 41, 42, 42:1, 43, 44, 46, 48, 51, 53, 55, 56, 60, 63, 65, 66, 67, 68, 69, 72, 76, 82, 83, 84, 86, 87, 90, 94, 105, 115, 117, 122, 127, 131, 132, 136, 141, 142, 143, 144, 145, 146, 149, 153, 159, 166, 168, 169, 172, 174, 175, 178, 180, 183, 187, 188, 189, 190, 191, 192, 199 or the like; and C.I. Direct Yellow 1, 2, 4, 5, 12, 13, 15, 20, 24, 25, 26, 32, 33, 34, 35, 41, 42, 44, 44:1, 45, 46, 48, 49, 50, 51, 61, 66, 67, 69, 70, 71, 72, 73, 74, 81, 84, 86, 90, 91, 92, 95, 107, 110, 117, 118, 119, 120, 121, 126, 127, 129, 132, 133, 134 or the like.

In one embodiment of the invention, an orange dye is C.I. Acid Orange 1, 1:1, 4, 5, 6, 7, 8, 9, 10, 12, 14, 16, 17, 18, 19, 20, 20:1, 22, 23, 24, 24:1, 25, 27, 28, 28:1, 30, 31, 33, 35, 36, 37, 38, 41, 45, 49, 50, 51, 54, 55, 56, 59, 79, 83, 94, 95, 102, 106, 116, 117, 119, 128, 131, 132, 134, 136, 138; and C.I. Direct Orange 1, 2, 3, 4, 5, 6, 7, 8, 10, 13, 17, 19, 20, 21, 24, 25, 26, 29, 29:1, 30, 31, 32, 33, 43, 49, 51, 56, 59, 69, 72, 73, 74, 75, 76, 79, 80, 83, 84, 85, 87, 88, 90, 91, 92, 95, 96, 97, 98, 101, 102, 102:1, 104, 108, 112, 114 or the like.

In one embodiment of the invention, a blue dye is C.I. Acid Blue 1, 2, 3, 4, 5, 6, 7, 8, 9, 11, 13, 14, 15, 17, 19, 21, 22, 23, 24, 25, 26, 27, 29, 34, 35, 37, 40, 41, 41:1, 43, 44, 45, 46, 47, 48, 49, 50, 51, 52, 53, 54, 55, 56, 57, 58, 62, 62:1, 63, 64, 65, 68, 69, 70, 73, 75, 78, 79, 80, 81, 83, 84, 85, 86, 88, 89, 90, 90:1, 91, 92, 93, 95, 96, 99, 100, 103, 104, 108, 109, 110, 111, 112, 113, 114, 116, 117, 118, 119, 120, 123, 124, 127, 127:1, 128, 129, 135, 137, 138, 143, 145, 147, 150, 155, 159, 169, 174, 175, 176, 183, 198, 203, 204, 205, 206, 208, 213, 227, 230, 231, 232, 233, 235, 239, 245, 247, 253, 257, 258, 260, 261, 262, 264, 266, 269, 271, 272, 273, 274, 277, 278, 280 or the like; and C.I. Direct Blue 1, 2, 3, 4, 6, 7, 8, 8:1, 9, 10, 12, 14, 15, 16, 19, 20, 21, 21:1, 22, 23, 25, 27, 29, 31, 35, 36, 37, 40, 42, 45, 48, 49, 50, 53, 54, 55, 58, 60, 61, 64, 65, 67, 79, 96, 97, 98:1, 101, 106, 107, 108, 109, 111, 116, 122, 123, 124, 128, 129, 130, 130:1, 132, 136, 138, 140, 145, 146, 149, 152, 153, 154, 156, 158, 158:1, 164, 165, 166, 167, 168, 169, 170, 174, 177, 181, 184, 185, 188, 190, 192, 193, 206, 207, 209, 213, 215, 225, 226, 229, 230, 231, 242, 243, 244, 253, 254, 260, 263 or the like.

In one embodiment of the invention, a purple dye is C.I. Acid Purple 1, 2, 3, 4, 5, 5:1, 6, 7, 7:1, 9, 11, 12, 13, 14, 15, 16, 17, 19, 20, 21, 23, 24, 25, 27, 29, 30, 31, 33, 34, 36, 38, 39, 41, 42, 43, 47, 49, 51, 63, 67, 72, 76, 96, 97, 102, 106, 109 or the like; and C.I. Direct Purple 1, 3, 4, 5, 6, 7, 8, 9, 10, 11, 12, 13, 14, 16, 17, 18, 21, 22, 25, 26, 27, 28, 29, 30, 31, 32, 34, 35, 36, 37, 38, 39, 40, 41, 42, 43, 45, 51, 52, 54, 57, 58, 61, 62, 63, 64, 71, 72, 77, 78, 79, 80, 81, 82, 83, 85, 86, 87, 88, 93, 97 or the like.

In one embodiment of the invention, a green dye is C.I. Acid Green 2, 3, 5, 6, 7, 8, 9, 10, 11, 13, 14, 15, 16, 17, 18, 19, 20, 22, 25, 25:1, 27, 34, 36, 37, 38, 40, 41, 42, 44, 54, 55, 59, 66, 69, 70, 71, 81, 84, 94, 95 or the like; and C.I. Direct Green 11, 13, 14, 24, 30, 34, 38, 42, 49, 55, 56, 57, 60, 78, 79, 80 or the like.

Based on 100 parts by weight of the used amount of the alkali-soluble resin (B), the used amount of the dye (G) is from 3 to 30 parts by weight; preferably 4 to 25 parts by weight; more preferably 5 to 20 parts by weight.

In one preferred embodiment of the invention, the photosensitive resin composition according to the present invention can further comprise an additives (H), such as fillers, polymers other than the alkali-soluble resin (B), adhesion-promoting agents, antioxidants, UV absorbents, anti-coagulants, cationic photoinitiators or the like so as to provide the filter segment made from the photosensitive resin composition with specifically required physical and chemical properties.

The aforesaid examples of the additives (H) can be used alone or in combinations. Examples of the fillers include but are not limited to glass, aluminum, or the like. Examples of the polymers other than the alkali-soluble resin (B) include polyvinyl alcohol, polyethylene glycol monoalkyl ether, polyfluoro alkyl acrylate, or the like. Examples of the adhesion-promoting agents include vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidyloxypropyltrimethoxysilane, 3-glycidyloxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryl oxypropyltrimethoxysilane, 3-mercaptopropyltrimethoxysilane, or the like. Examples of the antioxidants include 2,2-thiobis(4-methyl-6-t-butylphenol), 2,6-di-t-butylphenol, or the like. Examples of the UV absorbents include 2-(3-t-butyl-5-methyl-2-hydroxyphenyl)-5-chlorobenzotriazole, alkoxybenzophenone, or the like. Examples of the anti-coagulants include sodium polyacrylate, or the like.

Preferably, examples of the commercialized cationic photoinitiator are Adekaoptomer SP-150, Adekaoptomer SP-151, Adekaoptomer SP-152、Adekaoptomer SP-170, Adekaoptomer SP-172 (all manufactured by ADEKA Co., Ltd), UVI-6950, UVI-6970, UVI-6974, UVI-6990 (all manufactured by Union Carbide Co., Ltd), Irgacure 250, Irgacure 261 (all manufactured by Ciba Specialty Chemicals Co., Ltd), CI-2064, CI-2481, CI-2624, CI-2639 (all manufactured by Nippon Soda Co., Ltd.), CD-1010, CD-1011, CD-1012 (all manufactured by Sartomer Inc.), DTS-102, DTS-103, NAT-103, NDS-103, TPS-103, MDS-103, MPI-103, BBI-103 (all manufactured by Midori Kagaku Co., Ltd), PCI-020T, PCI-022T, PCI-061T, PCI-062T (all manufactured by Nippon Kayaku Co., Ltd.), CPI-110A (manufactured by SAN-APRO Co.).

Based on 100 parts by weight of the used amount of the alkali-soluble resin (B), the used amount of the additives (H) is from 0.1 to 100 parts by weight; preferably 1 to 80 parts by weight; more preferably 5 to 50 parts by weight.

The present invention also provides a method for manufacturing a color filter comprising forming a pixel layer with the photosensitive resin composition as mentioned above.

Preferably, the color filter comprises the pixel layer and the pixel layer is formed by the aforementioned photosensitive resin composition for the color filter.

The method for forming the color filter is coating the aforementioned solution state of the photosensitive resin composition on a substrate by various coating methods, for example, spin coating, cast coating or roll coating or the like. After coating process, the photosensitive resin composition is dried under reduced pressure to remove most of the solvent. After completely evaporating the residual solvent by pre-baking, a coating film is formed. Operation conditions for the drying under reduced pressure and the pre-baking depend on kinds and amounts of the components used in the photosensitive resin composition. In general, the drying under reduced pressure is carried out at a pressure from 0 to 200 mm Hg for a period from 1 to 60 seconds. The pre-baking is carried out at a temperature from 70° C. to 110° C. for a period from 1 to 15 minutes. After pre-baking, the coated film is exposed under a mask having specific patterns. After exposing process, the coated film is immersed in a developing solution at 23±2° C. for 15 seconds to 5 minutes, thereby remove undesired areas and forming a given pattern. The exposure light is preferably UV light such as g-line, h-line, i-line and so on, which may be generated by a UV illumination device such as (super) high-pressure mercury lamp or metal halide lamp.

Examples of the aforementioned substrate include but are not limited to alkali-free glass, Na—Ca glass, hard glass (Pyrex glass), quartz glass or that having an electrically conductive transparent film disposed thereon; a substrate of light-to-electricity conversion (for example, silicone substrate) utilized in a solid-camera device and the like. The substrate is usually formed a black matrix for separating the pixel colored layers firstly.

Examples of the developing solution include but are not limited to alkaline compounds such as sodium hydroxide, potassium hydroxide, sodium carbonate, sodium hydrogen carbonate, potassium carbonate, potassium hydrogen carbonate, sodium silicate, sodium methyl silicate, ammonia solution, ethylamine, diethylamine, dimethylethylanolamine, tetramethylammonium hydroxide, tetraethylammonium hydroxide, choline, pyrrole, piperidine, 1,8-diazabicyclo-[5,4,0]-7-undecene or the like. The concentration of the developing solution is 0.001 to 10 weight percent (wt %), preferably 0.005 to 5 weight percent (wt %), and more preferably 0.01 to 1 weight percent (wt %).

Thereafter, the patterns on the substrate are washed by water, and then dried by using compressed air or nitrogen gas.

Then, the patterns are subjected to a post-bake process with heating device such as a hot plate or an oven. The post-bake process can be carried out at 100° C. to 280° C. for 1 to 15 minutes, then volatile components are removed from the coated film, and the unreacted ethylenically unsaturated double bond on the coated film is performed on heat curing reaction. The pixel color layers such as red, green, blue and the like can be formed on the substrate by repeating the aforementioned steps.

An ITO protective film is sputtered on the surface of the pixel colored layer at 220° C. to 250° C. under vacuum environment. The ITO protective film is etched and patterned if necessary, and then an alignment film is applied on the surface of the ITO protective film, so as to produce the color filter of the present invention.

The present invention provides a liquid crystal display element comprising the color filter as mentioned above.

The liquid crystal display element according to the invention can be formed by the following method: the color filter substrate formed by the preparation method of the color filter and a driving substrate with a thin film transistor (TFT) are placed opposite to each other with a gap (cell gap) between the two, and then the surrounding area of the two substrates is laminated with a sealing agent. Next, a liquid crystal is injected into the gap separated by the surface of the substrates and the sealing agent to seal the injection hole and to form a liquid crystal cell. Then, a polarizer is laminated to the outer surface of the liquid crystal cell, i.e. the other side surfaces of each of the substrates forming the liquid crystal cell so as to fabricate the liquid crystal display element.

The present invention will provide more details hereinafter in the following embodiments, but it should be understood that these examples are only illustrative and for illustrative purposes and should not be construed to limit the present invention.

SYNTHESIS OF FIRST ALKALI-SOLUBLE RESIN (B-1)

Synthesis Example B-1-1

A 1000 ml four-necked conical flask equipped with a nitrogen inlet, a stirrer, a heater, a condenser and a thermometer was purged with nitrogen. In an environment with the nitrogen gas, 3 parts by weight of 1,2,2,6,6-pentamethylpiperidyl methacrylate (hereinafter as b-1-1-1), 45 parts by weight of 2-methacryloylethoxy succinate (hereinafter as HOMS), 12 parts by weight of dicyclopentenyl acrylate (hereinafter as FA-511A), 20 parts by weight of styrene (hereinafter as SM), 5 parts by weight of benzyl methacrylate (hereinafter as BzMA) and 15 parts by weight of methyl methacrylate (hereinafter as MMA) was continuously added into the four-necked conical flask and mixed uniformly. Then, the temperature of an oil bath was raised to 100° C. Four parts by weight of 2,2'-azobis-2-methyl butyronitrile (hereinafter as AMBN) was dissolved into ethyl 3-ethoxypropionate, divided equally into five portions, and added into the four-necked conical flask portionwise within an hour. Polymerization was conducted at 100° C. for 6 hours, and a polymerization product was then taken out of the conical flask followed by removal of solvent from the product so as to obtain the first alkali-soluble resin (B-1).

Synthesis Example B-1-2 to B-1-12

Synthesis Examples B-1-2 to B-1-12 were synthesized with the same method as in Synthesis Example B-1-1 by using various kinds or amounts of the reactants for the alkali-soluble resin (B-1). The formulations of Synthesis Examples B-1-2 to B-1-12 were listed in Table 1 rather than focusing or mentioning them in details.

Besides, as used in Table 1, the term "continuously added" refers to monomers for copolymerization that are continuously fed into the reactor and continuously reacting and discharging; and the term "simultaneously added" refers to monomers for copolymerization that are entirely fed into the reactor and after the reaction finished, the reactant is discharged simultaneously.

TABLE 1

| | Composition (parts by weight) | | | | | | | | | | |
|---|---|---|---|---|---|---|---|---|---|---|---|
| | Monomers for Copolymerization | | | | | | | | | | |
| | b-1-1 | | | b-1-2 | | | b-1-3 | | | | |
| Synthesis Example | b-1-1-1 | b-1-1-2 | MATP | HOMS | MAA | AA | FA-511A | FA-512A | SM | BzMA | MMA |
| B-1-1 | 3 | | | 45 | | | 12 | | 20 | 5 | 15 |
| B-1-2 | | 5 | | | 20 | | | 35 | | 40 | |
| B-1-3 | | | 15 | 20 | | 20 | | | 25 | | 20 |
| B-1-4 | 20 | | | 55 | | | 10 | | | 15 | |
| B-1-5 | | 25 | | | 15 | | | 30 | | 10 | 20 |
| B-1-6 | | | 30 | 50 | | | | | 10 | 10 | |
| B-1-7 | 20 | 20 | | | 35 | | 5 | | 10 | | 10 |
| B-1-8 | | 15 | 30 | | | 30 | | 15 | | 10 | |
| B-1-9 | | | | 45 | | | 15 | | 20 | 5 | 15 |
| B-1-10 | | | | | 35 | | | 35 | | 30 | |
| B-1-11 | | | | 20 | 20 | | | | 30 | | 30 |
| B-1-12 | | | | 30 | | | 35 | | | 35 | |

| | Composition (parts by weight) | | | Copolymerization Condition | | |
|---|---|---|---|---|---|---|
| | Initiator | | Solvent | Feeding manner | Reac. Temp. (° C.) | Reac. Time (hrs) |
| Synthesis Example | AMBN | ADVN | EEP | | | |
| B-1-1 | 4 | | 200 | continuously | 100 | 6 |
| B-1-2 | 4.5 | | 200 | simultanously | 105 | 6 |
| B-1-3 | 4 | | 200 | continuously | 100 | 5.5 |
| B-1-4 | | 4 | 200 | simultanously | 105 | 6 |
| B-1-5 | 4 | | 200 | continuously | 100 | 6 |
| B-1-6 | 4.5 | | 200 | simultanously | 105 | 6 |
| B-1-7 | 4 | | 200 | continuously | 100 | 5.5 |
| B-1-8 | | 4 | 200 | simultanously | 105 | 6 |
| B-1-9 | 4 | | 200 | continuously | 100 | 6 |
| B-1-10 | 4.5 | | 200 | simultanously | 105 | 6 |
| B-1-11 | 4 | | 200 | continuously | 100 | 5.5 |
| B-1-12 | | 4 | 200 | simultanously | 105 | 6 | b-1-1-1 1,2,2,6,6-pentamethyl-piperidyl methacrylate
b-1-1-2 2,2,6,6-tetramethyl-piperidyl methacrylate
MATP 4-methacrylamido-2,2,6,6-tetramethylpiperidine
HOMS 2-methacryloyloxyethyl succinate monoester
MAA methacrylic acid
AA acrylic acid
FA-511A dicyclopenteny acrylate
FA-512A dicyclopentenyloxyethyl acrylate
SM styrene monomer
BzMA benzyl methacrylate
MMA methyl methacrylate
AMBN 2,2'-azobis-2-methyl butyronitrile
ADVN 2,2'-Azobis(2,4-dimethylvaleronitrile)
EEP ethyl 3-ethoxypropionate

SYNTHESIS OF SECOND ALKALI-SOLUBLE RESIN (B-2)

Synthesis Example B-2-1

A 500 mL four-necked flask was continuously added with 100 parts by weight of a fluorene epoxy compound (Model ESF-300, manufactured by Nippon Steel Chemical Co., epoxy equivalent 231), 30 parts by weight of acrylic acid, 0.3 parts by weight of benzyltriethylammonium chloride, 0.1 parts by weight of 2,6-di-t-butyl-p-cresol, and 130 parts by weight of propylene glycol methyl ether acetate, wherein the feeding rate was controlled at 25 parts by weight/min, the temperature was maintained in the range of 100° C. to 110° C., and the mixture was reacted for 15 hours to obtain a light yellow and transparent mixture solution having a solid content concentration of 50 wt %.

Next, 100 parts by weight of the mixture solution was dissolved in 25 parts by weight of ethylene glycol ethyl ether acetate, and at the same time, 6 parts by weight of tetrahydrophthalic anhydride and 13 parts by weight of benzophenonetetracarboxylic dianhydride (BTDA) were added, and then the mixture solution was heated to 110° C. to 115° C. and reacted for 2 hours to obtain the second alkali-soluble resin (B-2-1), wherein the second alkali-soluble resin (B-2-1) had an acid value of 98.0 mgKOH/g and a weight averaged molecular weight was 2205.

Synthesis Example B-2-2

A 500 mL four-necked flask was continuously added with 100 parts by weight of a fluorene epoxy compound (Model ESF-300, manufactured by Nippon Steel Chemical Co., epoxy equivalent 231), 30 parts by weight of acrylic acid, 0.3 parts by weight of benzyltriethylammonium chloride, 0.1 parts by weight of 2,6-di-t-butyl-p-cresol, and 130 parts by weight of propylene glycol methyl ether acetate, wherein the feeding rate was controlled at 25 parts by weight/min, the temperature was maintained in the range of 100° C. to 110° C., and the mixture was reacted for 15 hours to obtain a light yellow and transparent mixture solution having a solid content concentration of 50 wt %.

Next, 100 parts by weight of the mixture solution was dissolved in 25 parts by weight of ethylene glycol ethyl ether acetate, and at the same time, 13 parts by weight of benzophenone tetracarboxylic dianhydride was added, and then the mixture solution was reacted for 2 hours at 90° C. to 95° C. Then, 6 parts by weight of tetrahydrophthalic anhydride was added, and the mixture solution was reacted for 4 hours at 90° C. to 95° C. to obtain the second alkali-soluble resin (B-2-2), wherein the second alkali-soluble resin (B-2-2) had an acid value of 99.0 mgKOH/g and a weight averaged molecular weight was 2630.

Synthesis Example B-2-3

A reaction vessel was added with 400 parts by weight of an epoxy compound (Model NC-3000, manufactured by Nippon Kayaku Co. Ltd.; epoxy equivalent 288), 102 parts by weight of acrylic acid, 0.3 parts by weight of methoxyphenol, 5 parts by weight of triphenyl phosphine, and 264 parts by weight of propylene glycol methyl ether acetate, wherein the temperature was maintained at 95° C. and the mixture was reacted for 9 hours to obtain an intermediate product having an acid value of 2.2 mgKOH/g. Then, 151 parts by weight of tetrahydrophthalic anhydride was added and the mixture was reacted for 4 hours at 95° C. to obtain the second alkali-soluble resin (B-2-3) having an acid value of 102 mgKOH/g and a weight averaged molecular weight of 3,200.

Synthesis Example B-2-4

A 500 mL four-necked flask was continuously added with 100 parts by weight of a fluorene epoxy compound (Model PG-100 manufactured by Osaka Gas Co., epoxy equivalent 260), 26 parts by weight of acrylic acid, 0.3 parts by weight of benzyltriethylammonium chloride, 0.1 parts by weight of 2,6-di-t-butyl-p-cresol, and 130 parts by weight of propylene glycol methyl ether acetate, wherein the feeding rate was controlled at 25 parts by weight/min, the temperature was maintained in the range of 100° C. to 110° C., and the mixture was reacted for 15 hours to obtain a light yellow and transparent mixture solution having a solid content concentration of 50 wt %.

Next, 100 parts by weight of the mixture solution was dissolved in 25 parts by weight of ethylene glycol ethyl ether acetate, and at the same time, 6 parts by weight of tetrahydrophthalic anhydride and 13 parts by weight of benzophenonetetracarboxylic dianhydride (BTDA) were added, and then the mixture solution was heated to 110° C. to 115° C. and reacted for 2 hours to obtain the second alkali-soluble resin (B-2-4), wherein the second alkali-soluble resin (B-2-1) had an acid value of 103 mgKOH/g and a weight averaged molecular weight was 2150.

Preparation of Photosensitive Resin Composition

EXAMPLES AND COMPARATIVE EXAMPLES

The following photosensitive resin compositions of Examples 1 to 10 and Comparative Examples 1 to 6 were prepared according to Table 2 and Table 3.

Examples 1

30 parts by weight of the pigment (A-1, wherein the ratio of C.I. Pigment R254 and Pigment Yellow 139 was 80/20), 100 parts by weight of the aforementioned first alkali-soluble resin synthesized by Synthesis Example B-1-1 (hereinafter as B-1-1), 5 parts by weight of the compound represented by Formula (4)(hereafter as C-1-1), 30 parts by weight of dipentaerythritol hexaacrylate (hereafter as D-1), 3 parts by weight of 2-methyl-1-(4-methylthiophenyl)-2-morpholin-1-propanone (hereafter as E-1), 3 parts by weight of 2,2'-bis(2,4-dichlorophenyl)-4,4',5,5'-tetraphenyl-1,2'-biimidazole (hereafter as E-2), 4 parts by weight of 4,4'-bis(diethylamino) benzophenone and 3 parts by weight of C.I. Acid Blue 25 (hereafter as G-1) were added into 500 parts by weight of 3-ethoxypropionate (hereafter as F-1) and were mixed and dissolved using a shaker to obtain a photosensitive resin composition for a color filter. The obtained photosensitive resin composition for a color filter was subjected to assays shown below and the results are shown in Table 2.

Examples 2 to 10 and Comparative Examples 1 to 6

The preparations of Examples 2 to 10 and Comparative Examples 1 to 6 were similar to that of Example 1 with modifications of the kinds and amounts of the compositions. The compositions and the results of the assays were shown in Tables 2 and 3.

TABLE 2

| Components | | | Examples | | | | | | | | | |
|---|---|---|---|---|---|---|---|---|---|---|---|---|
| | | | 1 | 2 | 3 | 4 | 5 | 6 | 7 | 8 | 9 | 10 |
| pigment (A) (parts by weight) | A-1 | | 30 | | | 100 | | | 200 | | | 300 |
| | A-2 | | | 60 | | | 150 | | | 250 | | |
| | A-3 | | | | 80 | | | 200 | | | 300 | |
| alkali-soluble resin (B) (parts by weight) | B-1 | B-1-1 | 100 | | | | | | | | 20 | |
| | | B-1-2 | | 100 | | | | | | | | 90 |
| | | B-1-3 | | | 100 | | | | | | | |
| | | B-1-4 | | | | 100 | | | | | | |
| | | B-1-5 | | | | | 100 | | | | | |
| | | B-1-6 | | | | | | 70 | | | | |
| | | B-1-7 | | | | | | | 50 | | | |
| | | B-1-8 | | | | | | | | 30 | | |
| | | B-1-9 | | | | | | | | | 40 | |
| | | B-1-10 | | | | | | | | | | 10 |
| | | B-1-11 | | | | | | | | | | |
| | | B-1-12 | | | | | | | | | | |
| | B-2 | B-2-1 | | | | | | 30 | | | | |
| | | B-2-2 | | | | | | | | 50 | | |
| | | B-2-3 | | | | | | | | | 70 | |
| | | B-2-4 | | | | | | | | | 40 | |
| cationic polymeric compound (C) (parts by weight) | C-1 | C-1-1 | 5 | | | | | | 60 | | | |
| | | C-1-2 | | 8 | | | | | | 70 | | |
| | | C-1-3 | | | 15 | | | | | | 80 | |
| | | C-1-4 | | | | 30 | | | 10 | | | 100 |
| | C-2 | C-2-1 | | 2 | | | 40 | | | | | |
| | | C-2-2 | | | | | | 50 | | | 20 | |
| compound (D) having an ethylenically unsaturated group (parts by weight) | D-1 | | 30 | | | 120 | | | 200 | | | 200 |
| | D-2 | | | 60 | | | 150 | | | 250 | 100 | 100 |
| | D-3 | | | | 120 | | | 200 | | | 200 | |
| photoinitiator (E) (parts by weight) | E-1 | | 3 | 5 | | 15 | 20 | | 25 | 30 | 50 | 50 |
| | E-2 | | 3 | 15 | 30 | 15 | 30 | 20 | 50 | | 40 | 30 |
| | E-3 | | 4 | | | | | 20 | | 35 | | |
| | E-4 | | | | 10 | 10 | | 25 | | 20 | | 20 |
| organic solvent (F) (parts by weight) | F-1 | | 500 | 1000 | 1500 | 2000 | 2500 | 3000 | | 2000 | 4500 | 3000 |
| | F-2 | | | | | | | | 3500 | 2000 | | 2000 |
| dye (G) (parts by weight) | G-1 | | 3 | | | | | | 20 | | | |
| | G-2 | | | | 10 | | | | | | 30 | |
| | G-3 | | | | | | 15 | | | | | |
| additives (H) (parts by weight) | H-1 | | | | | | | 1 | | | | |
| | H-2 | | | | | | | | | | | 5 |
| | H-3 | | | | | | | | 20 | | | |
| Assays | Developing-Resistance | | ○ | ◎ | ◎ | ◎ | ○ | ◎ | ☆ | ☆ | ☆ | ○ |
| | Voltage Holding Ratio | | ◎ | ◎ | ◎ | ◎ | ◎ | ◎ | ◎ | ◎ | ○ | ◎ |

TABLE 3

| Components | | | Comparative Examples | | | | | |
|---|---|---|---|---|---|---|---|---|
| | | | 1 | 2 | 3 | 4 | 5 | 6 |
| pigment (A) (parts by weight) | A-1 | | 100 | | | 100 | | |
| | A-2 | | | 150 | | | 150 | |
| | A-3 | | | | 200 | | | 200 |
| alkali-soluble resin (B) (parts by weight) | B-1 | B-1-1 | | | 100 | | | |
| | | B-1-2 | | | | 100 | | |
| | | B-1-3 | | | | | | |
| | | B-1-4 | | | | | | |
| | | B-1-5 | | | | | | |
| | | B-1-6 | | | | | | |
| | | B-1-7 | | | | | | |
| | | B-1-8 | | | | | | |
| | | B-1-9 | 100 | | | | | |
| | | B-1-10 | | 100 | | | | |
| | | B-1-11 | | | | | 100 | |
| | | B-1-12 | | | | | | 100 |
| | B-2 | B-2-1 | | | | | | |
| | | B-2-2 | | | | | | |
| | | B-2-3 | | | | | | |

TABLE 3-continued

| Components | | | Comparative Examples | | | | | |
|---|---|---|---|---|---|---|---|---|
| | | | 1 | 2 | 3 | 4 | 5 | 6 |
| | | B-2-4 | | | | | | |
| cationic polymeric | C-1 | C-1-1 | 40 | | | | | |
| compound (C) | | C-1-2 | | 50 | | | | |
| (parts by weight) | | C-1-3 | | | | | | |
| | | C-1-4 | | | | | | |
| | C-2 | C-2-1 | | | | | | |
| | | C-2-2 | | | | | | |
| compound (D) | D-1 | | 120 | | | 120 | | |
| having an | D-2 | | | 150 | | | 150 | |
| ethylenically | D-3 | | | | 200 | | | 200 |
| unsaturated group | | | | | | | | |
| (parts by weight) | | | | | | | | |
| photoinitiator (E) | E-1 | | 15 | 20 | | 10 | 15 | |
| (parts by weight) | E-2 | | 15 | 30 | 20 | 10 | 25 | 20 |
| | E-3 | | | | 20 | | | 20 |
| | E-4 | | 10 | | 25 | 5 | | 25 |
| organic solvent (F) | F-1 | | 2000 | 2500 | 3000 | | | |
| (parts by weight) | F-2 | | | | | 2000 | 2500 | 3000 |
| dye (G) | G-1 | | | | | | | |
| (parts by weight) | G-2 | | | | | | | |
| | G-3 | | | | | | | |
| additives (H) | H-1 | | | | | | | |
| (parts by weight) | H-2 | | | | | | | |
| | H-3 | | | | | | | |
| Assays | Developing-Resistance | | Δ | Δ | X | X | X | X |
| | Voltage Holding Ratio | | X | X | Δ | Δ | X | X |

In Table 2 and Table 3
A-1 C.I. Pigment R254/C.I. Pigment Y139=80/20
A-2 C.I. Pigment G36/C.I. Pigment Y150=60/40
A-3 C.I. Pigment B 15:6
C-1-1 the compound represented by Formula (4)
C-1-2 the compound represented by Formula (1)
C-1-3 the compound represented by Formula (2)
C-1-4 the compound represented by Formula (3)
C-2-1 TDVE (manufactured by Maruzen Petrochemical)
C-2-2 TMPVE (manufactured by Nippon Carbide Industries Co., Inc)
D-1 dipentaerythritol hexaacrylate (manufactured by Toagosei Company, Limited)
D-2 trimethylolpropyl triacrylate
D-3 TO-1382 (manufactured by Toagosei Company)
E-1 2-methyl-1-(4-methylthiophenyl)-2-morpholin-1-propanone
E-2 2,2'-bis(2,4-dichlorophenyl)-4,4',5,5'-tetraphenyl-1,2'-biimidazole
E-3 4,4'-bis(diethylamino)benzophenone
E-4 1-[4-(phenylthio)phenyl]-octane-1,2-dione 2-(O-benzoyloxime)
F-1 3-ethoxypropionate
F-2 propylene glycol methyl ether acetate
G-1 C.I. Acid Blue 25
G-2 C.I. Acid Red 289
G-3 C.I. Acid Green 5
H-1 3-glycidyloxypropyltrimethoxysilane
H-2 2,2-thiobis(4-methyl-6-t-butylphenol)
H-3 Adekaoptomer SP-150
<Evaluation Items>
Voltage Holding Ratio:
Firstly, a $SiO_2$ film was formed on a Na—Ca glass substrate for preventing sodium ions from being dissolved out, and then an ITO (Indium Tin Oxide) electrode with a given pattern was further evaporated on the Na—Ca glass substrate. And then, the resulted photosensitive resin compositions according to the aforementioned Examples and Comparative Examples were spin coated on the above-mentioned glass substrate. Next, the substrate was prebaked for 1 minute at 100° C. to form a prebaked coating film with a thickness of 2 μm. Then, the aforementioned prebaked coating film was irradiated under the light of 700 $J/m^2$ without covering the mask. The post-exposure coating film was immersed in a potassium hydroxide developing solution with the concentration of 0.04 wt %. After 1 minute, the substrate was cleaned by ultrapure water and air-dried. Afterwards, the post-exposure coating film was post-baked for 30 minutes at 230° C., thereby forming a cured coating film.

Next, a sealing agent was used to adhere the pixel substrate formed by the aforementioned curing coating film and the ITO electrode with the given evaporated pattern, and the glass beads with a diameter of 1.8 mm were placed in between thereof. The LC material (the trade name of MLC6608 was made by Merck Co. Ltd.) was injected into the cell gap defined by the aforementioned sealing agent, the pixel substrate and the driving substrate, so as to form an LC cell.

Then, the produced LC cell was placed into a thermostat at 60° C., and the voltage holding ratio (VHR) of the produced LC cell was measured at a square wave of 5.5 V and a frequency of 60 Hz by a VHR measuring instrument (Model No. VHR-1A was made by Toyo Co.).

The aforementioned VHR represents a value, which represents a potential difference of the LC cell after 16.7 milli-seconds divided by the voltage imposed to the LC cell at 0 milli-second. When the VHR of the LC cell is less than 90%, the produced LC cell is unable to maintain a stable voltage within 16.7 milli-seconds, and the situation easily causes the defect of retained image generated by the LC cell molecules. The evaluation criteria being as follows:

⊚: 95%≤VHR≤100%
○: 90%≤VHR≤95%
Δ: 80%≤VHR≤90%
X: VHR≤80%

Developing-Resistance:

The solution state photosensitive resin composition for the color filter was coated on a 100 mm×100 mm glass substrate using a rotation coating method, and decompression drying was first carried out at a pressure of 100 mmHg for 30 seconds. After pre-baking at a temperature of 80° C. for 2 minutes, a pre-baked coating film of 2.5 μm film thickness is formed. Then, the chromaticity (L*, a*, b*) was measured by the chromometer (Otsuka Electronics Co., Ltd., Model MCPD).

The aforementioned coating film was radiated with UV ray of 100 mJ/cm² (Canon PLA-501F) and immersed in the developer at 23° C. for 1 minute. Then, the film was washed with deionized water. The chromaticity was measured again. If the resulting change in chromaticity (ΔEab*) is smaller, the developing-resistance is better. The difference of the chromaticity (ΔEab*) was measured by Formula (IV) as below:

$$\Delta Eab^* = \{(\Delta L)^2 + (\Delta a)^2 + (\Delta b)^2\}^{1/2} \quad \text{Formula (IV)}$$

☆: ΔEab*<1
⊚: 1≤ΔEab*<2
○: 2≤ΔEab*<4
Δ: 4≤ΔEab*<6
X: 6≤ΔEab*

While embodiments of the present invention have been illustrated and described, various modifications and improvements can be made by persons skilled in the art. It is intended that the present invention is not limited to the particular forms as illustrated, and that all modifications not departing from the spirit and scope of the present invention are within the scope as defined in the following claims.

What is claimed is:

1. A photosensitive resin composition for a color filter comprising:
   a pigment (A);
   an alkali-soluble resin (B);
   a cationic polymeric compound (C);
   a compound (D) having an ethylenically unsaturated group;
   a photoinitiator (E); and
   an organic solvent (F);
   wherein:
   the alkali-soluble resin (B) comprises a first alkali-soluble resin (B-1) having a hindered-amine structure represented by Formula (I):

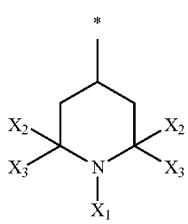

Formula (I)

in Formula (I):
$X_1$ represents a hydrogen atom, a $C_1$-$C_{18}$ linear alkyl group, branched alkyl group or cycloalkyl group, a $C_6$-$C_{20}$ aromatic group, a $C_7$-$C_{12}$ aromatic alkyl group, an acyl group, an oxygen free radical or —$OX_4$;

$X_2$ and $X_3$ independently represent a methyl group, an ethyl group, a phenyl group or $X_2$ and $X_3$ together represent a $C_4$-$C_{12}$ aliphatic ring;

$X_4$ represents a hydrogen atom, a $C_1$-$C_{18}$ linear alkyl group, branched alkyl group or cycloalkyl group, a $C_6$-$C_{20}$ aromatic group, or a $C_7$-$C_{12}$ aromatic alkyl group; and

* represents a covalent bond; and the alkali-soluble resin (B) comprises a second alkali-soluble resin (B-2), and the second alkali-soluble resin (B-2) is obtained by polymerizing a mixture comprising an epoxy compound (b-2-1) containing at least two epoxy groups, and a compound (b-2-2) containing at least one carboxylic acid group and at least one ethylenically unsaturated group;

based on 100 parts by weight of the total used amount of the alkali-soluble resin (B), the used amount of the first alkali-soluble resin (B-1) is from 30 parts by weight to 70 parts by weight, and the used amount of the second alkali-soluble resin (B-2) is from 30 parts by weight to 70 parts by weight.

2. The photosensitive resin composition for the color filter according to claim 1, wherein based on 100 parts by weight of the total used amount of the alkali-soluble resin (B), the used amount of the pigment (A) is from 30 parts by weight to 300 parts by weight; the used amount of the first alkali-soluble resin (B-1) is from 30 parts by weight to 100 parts by weight; the used amount of the cationic polymeric compound (C) is from 5 parts by weight to 100 parts by weight; the used amount of the compound (D) having the ethylenically unsaturated group is from 30 parts by weight to 300 parts by weight; the used amount of the photoinitiator (E) is from 10 parts by weight to 100 parts by weight; and the organic solvent (F) is from 500 parts by weight to 5000 parts by weight.

3. The photosensitive resin composition for the color filter according to claim 1, wherein the cationic polymeric compound (C) comprises an oxetane compound (C-1).

4. The photosensitive resin composition for the color filter according to claim 3, wherein based on 100 parts by weight of the total used amount of the alkali-soluble resin (B), the used amount of the oxetane compound (C-1) is from 8 parts by weight to 80 parts by weight.

5. The photosensitive resin composition for the color filter according to claim 1, wherein the epoxy compound (b-2-1) containing at least two epoxy groups comprises a structure represented by Formula (II) or a structure represented by Formula (III) or combinations thereof:

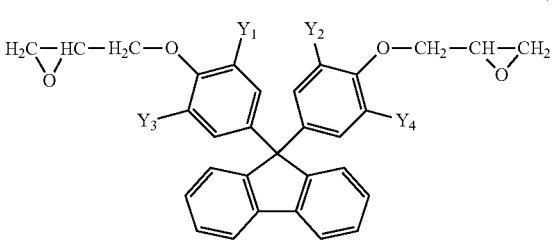

Formula (II)

in Formula (II):
$Y_1$, $Y_2$, $Y_3$, and $Y_4$ independently represent a hydrogen atom, a halogen atom, a $C_1$-$C_5$ alkyl group, a $C_1$-$C_5$ alkoxy group, a $C_6$-$C_{12}$ aromatic group or a $C_6$-$C_{12}$ aromatic alkyl group;

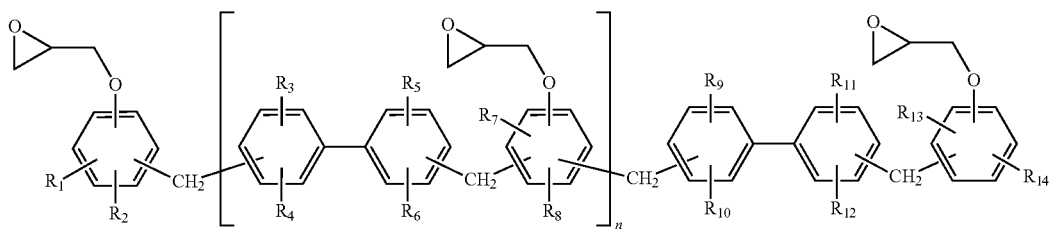

in Formula (III):
R₁ to R₁₄ independently represent a hydrogen atom, a halogen atom, a $C_1$-$C_8$ alkyl group or a $C_6$-$C_{15}$ aromatic group, and n represents an integer from 0 to 10.

6. A method for manufacturing a color filter comprising forming a pixel layer with the photosensitive resin composition for the color filter according to claim 1.

7. The method according to claim 6, wherein based on 100 parts by weight of the total used amount of the alkali-soluble resin (B), the used amount of the pigment (A) is from 30 parts by weight to 300 parts by weight; the used amount of the first alkali-soluble resin (B-1) is from 30 parts by weight to 100 parts by weight; the used amount of the cationic polymeric compound (C) is from 5 parts by weight to 100 parts by weight; the used amount of the compound (D) having the ethylenically unsaturated group is from 30 parts by weight to 300 parts by weight; the used amount of the photoinitiator (E) is from 10 parts by weight to 100 parts by weight; and the organic solvent (F) is from 500 parts by weight to 5000 parts by weight.

8. The method according to claim 6, wherein the cationic polymeric compound (C) comprises an oxetane compound (C-1).

9. The method according to claim 8, wherein based on 100 parts by weight of the total used amount of the alkali-soluble resin (B), the used amount of the oxetane compound (C-1) is from 8 parts by weight to 80 parts by weight.

10. A color filter manufactured by the method according to claim 6.

11. A liquid crystal display element comprising the color filter according to claim 10.

12. The method according to claim 1, wherein the epoxy compound (b-2-1) containing at least two epoxy groups comprises a structure represented by Formula (II) or a structure represented by Formula (III) or combinations thereof:

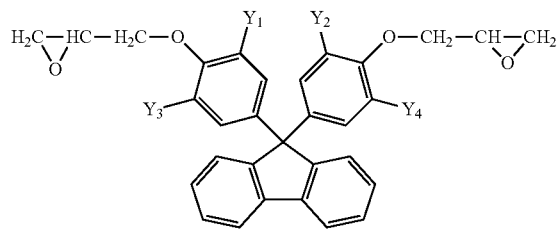

in Formula (II):
$Y_1$, $Y_2$, $Y_3$, and $Y_4$ independently represent a hydrogen atom, a halogen atom, a $C_1$-$C_5$ alkyl group, a $C_1$-$C_5$ alkoxy group, a $C_6$-$C_{12}$ aromatic group or a $C_6$-$C_{12}$ aromatic alkyl group;

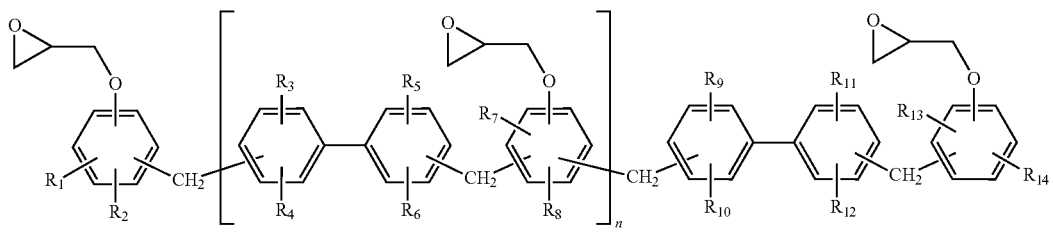

in Formula (III):
R₁ to R₁₄ independently represent a hydrogen atom, a halogen atom, a $C_1$-$C_8$ alkyl group or a $C_6$-$C_{15}$ aromatic group, and n represents an integer from 0 to 10.

* * * * *